United States Patent
Lee et al.

(10) Patent No.: US 9,472,282 B2
(45) Date of Patent: Oct. 18, 2016

(54) RESISTIVE MEMORY DEVICE AND METHOD OF OPERATING THE SAME

(71) Applicant: SAMSUNG ELECTRONICS CO., LTD.

(72) Inventors: Yong-Kyu Lee, Hwaseong-Si (KR); Yeong-Taek Lee, Seoul (KR); Dae-Seok Byeon, Seongnam-Si (KR); Chi-Weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/979,947

(22) Filed: Dec. 28, 2015

(65) Prior Publication Data

US 2016/0196876 A1    Jul. 7, 2016

(30) Foreign Application Priority Data

Jan. 6, 2015    (KR) .................. 10-2015-0001179

(51) Int. Cl.
*G11C 13/00*    (2006.01)
*G11C 5/06*    (2006.01)

(52) U.S. Cl.
CPC ........... *G11C 13/0069* (2013.01); *G11C 5/063* (2013.01)

(58) Field of Classification Search
CPC .......... G11C 13/0069; G11C 11/5685; G11C 11/5642; G11C 5/063; G11C 7/067; G11C 7/18; G11C 17/16
See application file for complete search history.

(56) References Cited

U.S. PATENT DOCUMENTS

| | | | |
|---|---|---|---|
| 6,191,445 B1 | 2/2001 | Fujiwara | |
| 8,320,158 B2 | 11/2012 | Kanno et al. | |
| 8,817,540 B2 | 8/2014 | Lee et al. | |
| 8,929,124 B2 | 1/2015 | Kim et al. | |
| 2007/0069241 A1* | 3/2007 | Yang | G11C 17/16 257/209 |
| 2009/0027967 A1 | 1/2009 | Lee | |
| 2011/0019495 A1* | 1/2011 | Scheuerlein | G11C 7/18 365/230.06 |
| 2011/0128772 A1* | 6/2011 | Kim | G11C 5/063 365/148 |
| 2012/0044770 A1 | 2/2012 | Lee et al. | |
| 2012/0195127 A1 | 8/2012 | Nakatake | |
| 2013/0223127 A1 | 8/2013 | Park et al. | |
| 2014/0104926 A1* | 4/2014 | Sutardja | G11C 7/067 365/148 |
| 2014/0185362 A1 | 7/2014 | Haukness | |
| 2014/0347912 A1* | 11/2014 | Siau | G11C 7/062 365/148 |

FOREIGN PATENT DOCUMENTS

| | | |
|---|---|---|
| JP | 11-330277 A | 11/1999 |
| JP | 2012-160244 A | 8/2012 |

(Continued)

*Primary Examiner* — Harry W Byrne
*Assistant Examiner* — Ajay Ojha
(74) *Attorney, Agent, or Firm* — Volentine & Whitt, PLLC

(57) ABSTRACT

A resistive memory device includes a memory cell array that has a plurality of resistive memory cells that are arranged respectively on regions where a plurality of first signal lines and a plurality of second signal lines cross each other. A write circuit is connected to a selected first signal line that is connected to a selected memory cell from among the plurality of memory cells, and provides pulses to the selected memory cell. A voltage detector detects a node voltage at a connection node between the selected first signal line and the write circuit. A voltage generation circuit generates a first inhibit voltage and a second inhibit voltage that are applied respectively to unselected first and second signal lines connected to unselected memory cells from among the plurality of memory cells, and changes a voltage level of the second inhibit voltage based on the node voltage that is detected.

20 Claims, 23 Drawing Sheets

(56) References Cited

FOREIGN PATENT DOCUMENTS

| KR | 1020090010481 A | 1/2009 |
| KR | 1020130074294 A | 7/2013 |
| KR | 1020130098003 A | 9/2013 |
| KR | 1020130104033 A | 9/2013 |

* cited by examiner

EL1  DS  EL2

RESISTIVE MEMORY DEVICE AND METHOD OF OPERATING THE SAME

CROSS-REFERENCE TO RELATED APPLICATIONS

This application claims the benefit of Korean Patent Application No. 10-2015-0001179, filed on Jan. 6, 2015, in the Korean Intellectual Property Office, the disclosure of which is incorporated herein in its entirety by reference.

FIELD

The inventive concept relates to a memory device, and more particularly, to a resistive memory device and a method of operating the resistive memory device.

BACKGROUND

As the demand for high capacity and low power consumption memory devices has increased, research into next-generation memory devices such as non-volatile memory devices that do not require a refresh operation has been actively conducted. These next-generation memory devices should have a high integrity characteristic like that of a Dynamic Random Access Memory (DRAM), have a non-volatile characteristic like that of a flash memory, and have high speed like that of a static RAM (SRAM). Phase-change RAM (PRAM), Nano Floating Gate Memory (NFGM), Polymer RAM (PoRAM), Magnetic RAM (MRAM), Ferroelectric RAM (FeRAM), and Resistive RAM (RRAM) have been highlighted as some of the next-generation memory devices, for example.

SUMMARY

The inventive concept may provide a memory device capable of reducing a leakage current that may occur in unselected memory cells due to an increase in a write pulse according to the number of programming loops, and may improve controllability of a cell current flowing in a selected memory cell, when a writing operation is performed in the memory device.

The inventive concept may provide a method of operating a memory device capable of reducing a leakage current that may occur in unselected memory cells due to an increase in a write pulse according to the number of programming loops, and may improve controllability of a cell current flowing in a selected memory cell, when a writing operation is performed in the memory device.

According to an aspect of the inventive concept, there is provided a resistive memory device including: a memory cell array including a plurality of resistive memory cells that are arranged respectively on regions where a plurality of first signal lines and a plurality of second signal lines cross each other; a write circuit connected to a selected first signal line that is connected to a selected memory cell from among the plurality of memory cells, and providing a plurality of pulses sequentially to the selected memory cell; a voltage detector for detecting a node voltage at a connection node between the selected first signal line and the write circuit; and a voltage generation circuit for generating a first inhibit voltage and a second inhibit voltage that are applied respectively to unselected first and second signal lines connected to unselected memory cells from among the plurality of memory cells, and changing a voltage level of the second inhibit voltage based on the node voltage that is detected.

The write circuit may generate the plurality of pulses based on a first voltage, and the voltage detector may receive the first voltage from the write circuit and detects the node voltage based on the first voltage.

The write circuit may include: a reference current generator for generating a reference current and outputting the first voltage; and a pulse generator for generating the plurality of pulses based on the first voltage and providing the plurality of pulses via the first signal line.

The voltage detector may include: a pulse copy unit for generating a plurality of copy pulses that are substantially the same as the plurality of pulses based on the first voltage; and a load circuit unit connected to the pulse copy unit and receiving the plurality of copy pulses.

The voltage detector may detect a voltage level at a connection node between the pulse copy unit and the load circuit as the voltage level of the node voltage.

The pulse copy unit may include a current mirroring circuit that generates the copy pulses by mirroring the reference current based on the first voltage.

The load circuit may include a resistor, and the resistor may have a resistance value that is substantially equal to a sum of resistance components of the selected memory cell, and the selected first line and a second signal line connected to the selected memory cell.

The load circuit may include a reference cell array corresponding to a row or a column in the memory cell array. Reference cells included in the reference cell array may correspond to memory cells included in the first signal line, and a voltage that is substantially equal to a voltage applied to each memory cell corresponding to the reference cell may be applied to each of the reference cells.

The plurality of pulses may include a plurality of current pulses, and the write pulse may increase at least one of an amplitude and a pulse width of each of the plurality of current pulses according to the number of times programming loops are performed.

The voltage generation circuit may adjust a voltage level of the second inhibit voltage to be reduced if a voltage level of the node voltage decreases.

The voltage generation circuit may adjust the voltage level of the second inhibit voltage to be increased if the voltage level of the node voltage increases.

According to an aspect of the inventive concept, there is provided a resistive memory device including: a memory cell array including a plurality of resistive memory cells that are arranged respectively on regions where a plurality of first signal lines and a plurality of second signal lines cross each other; a write circuit for providing a plurality of set pulses sequentially to a selected first signal line that is connected to a selected memory cell, wherein at least one of an amplitude or a pulse width of each of the plurality of set pulses increases according to a number of times programming loops are performed; and an inhibit voltage generator generating a first inhibit voltage and a second inhibit voltage that are respectively applied to unselected first signal lines and unselected second signal lines connected to unselected memory cells, and changing a voltage level of the second inhibit voltage according to a variation in a voltage of the selected first signal line due to the increase of the plurality of set pulses.

The inhibit voltage generator may include: a voltage detector for detecting a voltage level of the selected first signal line; and a voltage generation circuit adjusting the voltage level of the second inhibit voltage based on the voltage level of the selected first signal line.

The plurality of set pulses may correspond to a plurality of current pulses, the write circuit may include a pulse generator for generating the plurality of current pulses based on a reference current, the inhibit voltage generator may include a pulse copy unit for generating a plurality of copy current pulses that are substantially equal to the plurality of current pulses based on the reference current, and a load circuit to which the plurality of current pulses are applied, and the inhibit voltage generator may detect a variation in the voltage level of the selected first signal line based on a voltage at a connection node between the pulse copy unit and the load circuit.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
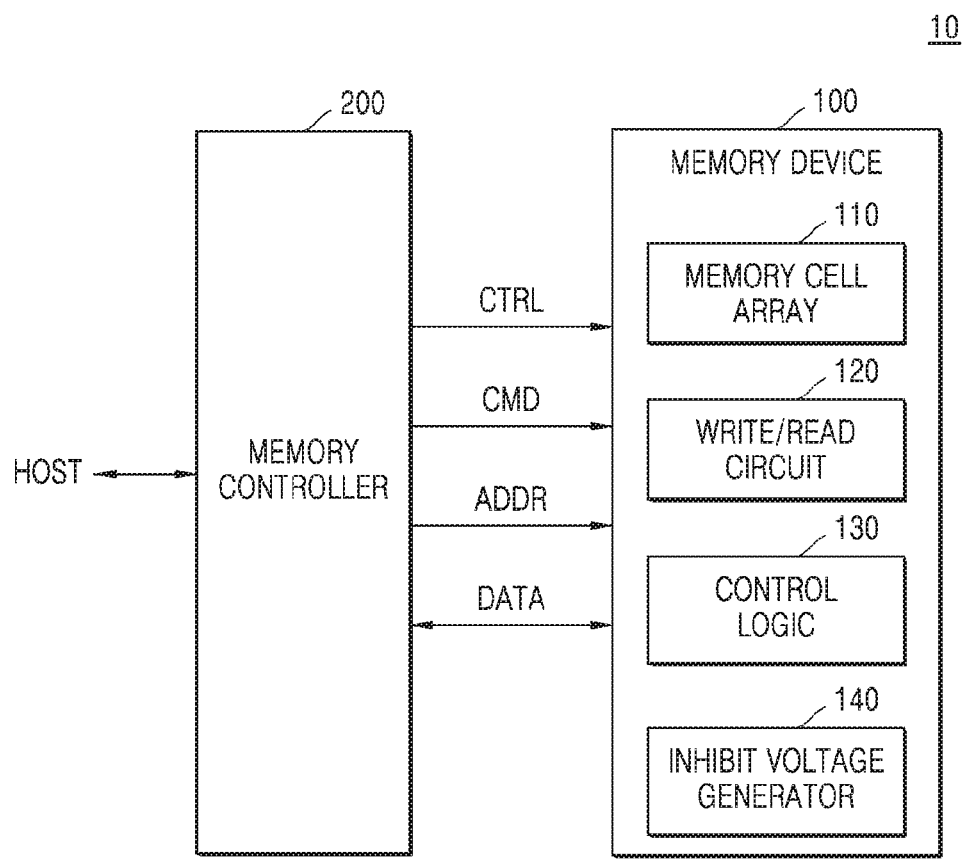
FIG. 1 is a block diagram of a memory system according to an exemplary embodiment of the inventive concept.

The present inventive concept will now be described more fully with reference to the accompanying drawings, in which exemplary embodiments of the inventive concept are shown. The inventive concept may, however, be embodied in many different forms, and should not be construed as being limited to the exemplary embodiments set forth herein. Thus, the inventive concept may include all revisions, equivalents, or substitutions which are included in the concept and the technical scope related to the present inventive concept. Like reference numerals in the drawings denote like elements. In the drawings, the dimension of structures may be exaggerated for clarity.

Furthermore, all examples and conditional language recited herein are to be construed as being not limited to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it should be understood that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are understood by one of ordinary skill in the art. Also, terms that are defined in a general dictionary and that are used in the following description should be construed as having meanings that correspond to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a memory system 10 including a resistive memory device 100, according to an exemplary embodiment of the present inventive concept.

Referring to FIG. 1, the memory system 10 may include the resistive memory device 100 (hereinafter, referred as the memory device 100) and a memory controller 200. The memory device 100 may include a memory cell array 110, a write/read circuit 120, and control logic 130. Also, the memory device 100 may further include circuits performing writing and reading operations on the memory cell array 110 according to control by the control logic 130. Since the memory cell array 110 includes resistive memory cells, the memory system 10 may be called a resistive memory system.

In response to a write/read request from a host, the memory controller 200 may read data stored in the memory device 100 or may control the memory device 100 to write data to the memory device 100. In more detail, the memory controller 200 may provide an address ADDR, a command CMD, and a control signal CTRL to the memory device 100 and thus may control a program (or write) operation, a read operation, and an erase operation with respect to the memory device 100. Also, data DATA to be written and data DATA to be read may be exchanged between the memory controller 200 and the memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may include a protocol for exchanging data between the host and the memory controller 200. For example, the memory controller 200 may communicate with an external source (i.e., the host) by using at least one of various interface protocols including Universal Serial Bus (USB), MultiMediaCard (MMC), Peripheral Component Interconnect Express (PCI-E), Advanced Technology Attachment (ATA), Serial-ATA, Parallel-ATA, Small Computer System Interface (SCSI), Earth Science Data Interface (ESDI), and Integrated Drive Electronics (IDE).

The memory cell array 110 may include a plurality of memory cells (not shown) that are disposed respectively in regions where a plurality of first signal lines and a plurality of second signal lines cross each other. The memory device 100 including such above memory cell array 110 may be referred to as a cross point memory device.

In the present exemplary embodiment, the plurality of first signal lines may be a plurality of word lines, and the plurality of second signal lines may be a plurality of bit lines. In another exemplary embodiment, the plurality of first signal lines may be a plurality of bit lines, and the plurality of second signal lines may be a plurality of word lines.

In the present exemplary embodiment, each of the plurality of memory cells may be a single level cell (SLC) that stores one bit data, or may be a multilevel cell (MLC) that may store at least two-bit data. Alternatively, the memory cell array 110 may include both the SLC and the MLC.

The SLC may have a low resistance state or a high resistance state, and the low resistance state may be referred to as a set state and the high resistance state may be referred to as a reset state. The MLC may have one of at least four resistance states. For example, when two-bit data is written to one memory cell, the memory cells may have four resistance level distributions according to the written data. In another exemplary embodiment, if a memory cell is a triple level cell (TLC) that stores three-bit data, the memory cells may have eight resistance level distributions.

In the present exemplary embodiment, the memory cell array 110 may include memory cells with a two-dimensional (2D) horizontal structure. In another exemplary embodiment, the memory cell array 110 may include memory cells with a three-dimensional (3D) vertical structure.

According to an exemplary embodiment, the memory cell array 110 may include a plurality of cell regions. The cell regions may be defined in various ways. For example, the cell region may be a page unit including a plurality of memory cells connected to the same word line. As another example, the cell region may include a plurality of memory cells, and the plurality of memory cells are connected to the word lines and the bit lines. In addition, the word lines may be connected to one row decoder and the bit lines may be connected to one column decoder, and the above-described cell region may be defined as a tile.

The memory cell array 110 may include resistance-type memory cells or resistive memory cells that include a variable resistor device (not shown) having a variable resistor. As one example, when resistance of the variable resistor device that is formed of a phase change material (e.g., Ge—Sb—Te) is changed according to a temperature, a resistive memory device may be a phase change RAM (PRAM). As another example, when the variable resistor device is formed of complex metal oxide including an upper electrode, a lower electrode, and transition metal oxide therebetween, the resistive memory device may be a resistive RAM (ReRAM). As another example, when the variable resistor device is formed of an upper electrode of a magnetic material, a lower electrode of the magnetic material, and a dielectric therebetween, the resistive memory device may be a magnetic RAM (MRAM). Hereinafter, it will be assumed that the memory cell array 110 is a ReRAM.

The write/read circuit 120 performs write and read operations on the memory cells. The write/read circuit 120 may be selectively connected to a selected first signal line or a selected second signal line connected to a selected memory cell, and provides the selected memory cell with a current pulse or a voltage pulse via the selected first or second signal line to perform the write and read operations on the memory cell. In one exemplary embodiment, if the write/read circuit 120 is connected to the selected first signal line, a plurality of pulses may be applied to the selected memory cell via the selected first signal line. In another exemplary embodiment, if the write/read circuit 120 is connected to the selected second signal line, the plurality of pulses may be applied to the selected memory cell via the selected second signal line.

The write/read circuit 120 may execute programming loops on the selected memory cell. Here, the total number of programming loops may be set as N in advance, wherein N is a natural number equal to or greater than 2. In the present exemplary embodiment, the write/read circuit 120 may apply first to N-th pulses, at least one of an amplitude or a pulse width of which increases according to the number of times the programming loops are performed, to the selected memory cell sequentially, so as to perform the programming operation on the selected memory cell.

The control logic 130 may control the write/read operations of the memory device 100. The control logic 130 may control the write/read circuit 120 for performing memory operations such as write or read operations.

The control logic 130 may determine the plurality of pulses so that each of the plurality of pulses that are sequentially applied to the selected memory cell increases according to the number of times the programming loops are performed. In particular, the control logic 130 may determine the plurality of pulses so that at least one of the amplitude or the pulse width of each of the plurality of pulses may increase according to the number of times the programming loops are performed.

An inhibit voltage generator 140 may generate first and second inhibit voltages applied to unselected memory cells. The first and second inhibit voltages may be respectively applied to unselected first and second signal lines connected to the unselected memory cells. When a write operation and a read operation are performed with respect to the memory cell array 110, the first and second inhibit voltages are applied to the unselected memory cells to prevent an excessive leakage current from being generated in the unselected memory cells.

In addition, as described above, since the at least one of the amplitude and the pulse width of the plurality of pulses provided to the selected memory cell increases according to the number of times the programming loops are performed when the write operation is performed with respect to the memory cell array 110, a voltage of the selected first or second signal line to which the write/read circuit 120 is connected may be changed. If the voltage of the selected first or second signal line is changed, a voltage difference between the selected first or second signal line and the unselected first or second signal line may increase, and accordingly, the leakage current occurring in the unselected memory cells may increase.

According to the present exemplary embodiment, the inhibit voltage generator 140 may change a voltage level of at least one of the first and second inhibit voltages, according to the change in the voltage of the selected first or second signal line to which the write/read circuit 120 is connected.

In one exemplary embodiment, if the voltage of the selected first or second signal line connected to the write/read circuit 120 decreases, the inhibit voltage generator 140 may adjust the voltage level of at least one of the first and second inhibit voltages to be reduced. For example, if the voltage of the selected first signal line is reduced, the inhibit voltage generator 140 may reduce the voltage level of the second inhibit voltage. If the voltage of the second signal line is reduced, the inhibit voltage generator 140 may reduce the voltage level of the first inhibit voltage.

In another exemplary embodiment, if the voltage of the selected first or second signal line to which the write/read circuit 120 is connected is increased, the inhibit voltage generator 140 may adjust the voltage level of at least one of the first and second inhibit voltages to be increased.

In one exemplary embodiment, the inhibit voltage generator 140 detects a node voltage of a connection node between the selected first or second signal line and the write/read circuit 120, and may adjust the voltage level of at least one of the first and second inhibit voltages based on the detected node voltage.

As described above, the memory system 10 according to the present exemplary embodiment may adjust the voltage level of at least one of the first and second inhibit voltages according to the variation in the voltage level of the selected first or second signal line. Accordingly, the voltage difference between the selected first or second signal line and the unselected first or second signal line may not increase even with the variation in the voltage level of the selected first or second signal line, and the leakage current occurring in the unselected memory cells may be reduced.

Also, the memory system 10 decreases the leakage current that may occur in the unselected memory cells, thereby stably supplying a set current provided from the write circuit to the selected memory cell. Thus, a controllability of the cell current flowing in the selected memory cell may be improved.

In addition, the memory controller 200 and the memory device 100 may be integrated to a semiconductor device. For example, the memory controller 200 and the memory device 100 may be integrated to the semiconductor device and thus may configure a memory card. As one example, the memory controller 200 and the memory device 100 may be integrated to the semiconductor device and thus may configure a PC card (a PCMCIA card), a compact flash card (CF card), a smart media card (SM/SMC), a memory stick, a multimedia card (MMC, RS-MMC, or MMCmicro), a secure digital (SD) card (SD, miniSD, or microSD), or universal flash storage (UFS). As another example, the memory controller 200 and the memory device 100 may be integrated to the semiconductor device and thus may configure a Solid State Disk/Drive (SSD).

Figure 2:
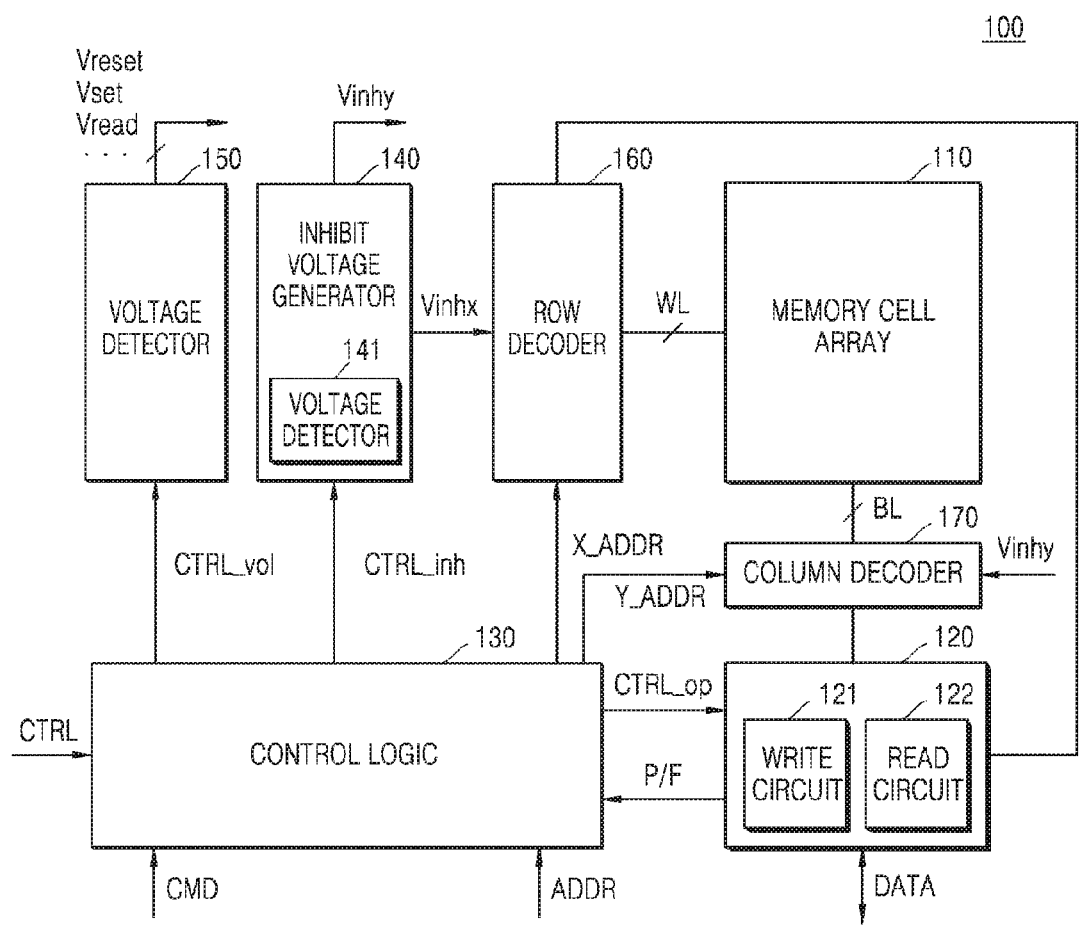
FIG. 2 is a block diagram of an example of a memory device of FIG. 1.

FIG. 2 is a block diagram of the memory device 100 of FIG. 1, according to an exemplary embodiment of the inventive concept.

Referring to FIG. 2, the memory device 100 may include the memory cell array 110, the write/read circuit 120, the control logic 130, the inhibit voltage generator 140, a voltage generator 150, a row decoder 160, and a column decoder 170. Also, the write/read circuit 120 may include a write circuit 121 and a read circuit 122. Hereinafter, the elements included in the memory device 100 will be described below.

The memory cell array 110 may be connected to a plurality of first signal lines and a plurality of second signal lines. Also, the memory cell array 110 may include a plurality of memory cells that are respectively arranged on regions where the plurality of first signal lines and the plurality of second signal lines cross each other. Hereinafter, it is assumed that the plurality of first signal lines are word lines WL, and the plurality of second signal lines are bit lines BL.

The row decoder 160 is connected to the memory cell array 110 via the plurality of word lines WL, and may activate a selected word line from among the plurality of word lines in response to a row address X_ADDR transmitted from the control logic 130. In particular, the row decoder 160 may control a voltage applied to the selected word line or connecting relation of the selected word line from among the plurality of word lines WL in response to the row address X_ADDR.

The column decoder 170 is connected to the memory cell array 110 via the plurality of bit lines BL, and may activate a selected bit line from among the plurality of bit lines BL in response to a column address Y_ADDR transmitted from the control logic 130. In particular, the column decoder 170 may control a voltage applied to the selected bit line or the connecting relation of the selected bit line from among the plurality of bit lines BL in response to the column address Y_ADDR.

The write/read circuit 120 may be selectively connected to the row decoder 160 or the column decoder 170, and accordingly, may be selectively connected to the word line WL or the bit line BL. In one exemplary embodiment, the write circuit 121 or the read circuit 122 may be connected to the word line WL. In another exemplary embodiment, the write circuit 121 and the read circuit 122 may be connected to the bit line BL. In another exemplary embodiment, the write circuit 121 may be connected to the word line WL, and the read circuit 122 may be connected to the bit line BL. In another exemplary embodiment, the write circuit 121 may be connected to the bit line BL, and the read circuit 122 may be connected to the word line WL.

In the present exemplary embodiment, the write/read circuit 120 may be connected to one of the word line WL and the bit line BL, which has a relatively lower voltage, according to a type of operation performed with respect to the memory cell array 110. For example, if the write operation is performed with respect to the memory cell array 110, a relatively high voltage may be applied to the bit line BL and a relatively low voltage may be applied to the word line WL, and then, the write/read circuit 120 may be connected to the word line WL. However, one or more exemplary embodiments are not limited thereto, that is, the write/read circuit 120 may be connected to one of the word line WL and the bit line BL having a relatively high voltage.

The write circuit 121 is connected to the selected bit line or the selected word line to provide pulses to the selected memory cell MC to perform a programming operation (that is, the write operation). Accordingly, data DATA to be stored in the memory cell array 110 may be input. Here, the pulse may be referred to as a programming pulse or a write pulse. In one exemplary embodiment, the pulse may be a current pulse or a voltage pulse.

In particular, the write circuit 121 may perform a set writing operation for programming the memory cell MC so that a resistance of the selected memory cell MC is reduced. In one exemplary embodiment, the write circuit 121 may provide the current pulse to the selected memory cell MC when the set writing operation is performed.

Also, the write circuit 121 may perform a reset writing operation for programming the memory cell MC so that a resistance of the memory cell MC is increased. In one exemplary embodiment, the write circuit 121 may provide the voltage pulse to the selected memory cell MC when the reset writing operation is performed.

In the present exemplary embodiment, the write circuit 121 may provide first to N-th current pulses sequentially to the selected memory cell MC, and the first to N-th current pulses may have voltage levels that are increased as the number of times the programming loops are performed increases. In one exemplary embodiment, the write circuit 121 may provide the first to N-th current pulses sequentially to the selected memory cell MC so as to perform the set writing operation on the selected memory cell MC.

Also, in the present exemplary embodiment, the write circuit 121 may provide first to N-th voltage pulses sequentially to the selected memory cell MC, and the first to N-th voltage pulses may have the voltage levels that are increased as the number of times the programming loops are performed increases. In one exemplary embodiment, the write circuit 121 may provide the first to N-th voltage pulses sequentially to the selected memory cell MC so as to perform the reset writing operation on the selected memory cell MC.

In one exemplary embodiment, each of the programming loops may include the programming operation (that is, the write operation) and a verification operation that are sequentially performed. In another exemplary embodiment, at least some of the plurality of programming loops may only include the programming operations. For example, some of the programming loops, which are executed initially from among the N programming loops, may include the programming operations only, without performing the verification operation, and thus, the operating speed may be improved.

The read circuit 122 is connected to the selected bit line BL or the selected word line WL to read the data DATA stored in the selected memory cell MC, and accordingly, the data DATA stored in the memory cell array 110 may be output. In particular, the read circuit 122 may perform a general read operation on the selected memory cell MC when receiving a read command from the memory controller 200. Also, before performing the write operation on the selected memory cell MC, the read circuit 122 may perform a read operation on the selected memory cell MC in advance to perform a pre-read operation for detecting an initial resistance state of the selected memory cell MC.

Moreover, the read circuit 122 may perform a verify read operation for determining whether the writing operation on the selected memory cell MC is finished after performing the writing operation on the selected memory cell MC. In particular, the read circuit 122 reads a resistance of each of the selected memory cells MC to which the first to N-th pulses are respectively applied, and may provide the reading result to the write circuit 121 or the control logic 130.

In a general read operation, the read circuit 122 may provide the read data DATA to an external destination of the memory device 100, for example, the memory controller 200. In addition, in a case of the pre-read operation or the verify read operation, the read circuit 122 may provide the read data DATA to an internal destination of the memory device 100, for example, the control logic 130 or the write circuit 121, as a pass/fail (P/F) signal representing whether the write operation has succeeded or not.

The control logic 130 may output various control signals for writing the data DATA in the memory cell array 110 or reading the data DATA from the memory cell array 110 based on the command CMD, the address ADDR, and the control signal CTRL transmitted from the memory controller 200. The various control signals output from the control logic 130 may be provided to the write/read circuit 120, the inhibit voltage generator 140, the voltage generator 150, the row decoder 160, and the column decoder 170, and accordingly, the control logic 130 may control overall operations in the memory device 100.

In particular, the control logic 130 may generate operation control signals CTRL_op based on the command CMD and the control signal CTRL, and may provide the operation control signals CTRL_op to the write/read circuit 120. For example, the operation control signals CTRL_op may include a write enable signal (WEN), a read enable signal (REN), a sense enable signal (SEN), a discharge signal (DIS), a precharge enable signal (PRE), and a write control signal (WCS), and these will be described later with reference to FIGS. 12 and 18.

Also, the control logic 130 may generate a voltage control signal CTRL_vol and an inhibit control signal CTRL_inh based on the command CMD, the control signal CTRL, and the P/F signal transmitted from the read circuit 122. The control logic 130 may provide the generated voltage control signal CTRL_vol and the inhibit voltage signal CTRL_inh respectively to the voltage generator 150 and the inhibit voltage generator 140.

Here, the voltage control signal CTRL_vol is a signal for adjusting voltage levels of the voltages generated from the voltage generator 150, and the inhibit control signal CTRL_inh adjusts voltage levels of the inhibit voltages provided from the inhibit voltage generator 140.

Moreover, the control logic 130 divides the address ADDR into the row address X_ADDR and the column address Y_ADDR, and provides the row decoder 160 with the row address X_ADDR and provides the column decoder 170 with the column address Y_ADDR.

The voltage generator 150 may generate various types of voltages for performing the writing, reading, and erasing operations on the memory cell array 110 based on a voltage control signal CTRL_vol. The voltage generator 150 may generate a set write voltage Vset, a reset write voltage Vreset, and a read voltage Vread. In addition, the voltage generator 150 may generate a power voltage Vdd and a precharge voltage Vpre applied to the write/read circuit 120. Also, the voltage generator 150 may generate a control voltage Vc that is necessary for generating pulses in the write circuit 121.

The inhibit voltage generator 140 may generate a first inhibit voltage Vinhy applied to an unselected bit line and a second inhibit voltage Vinhx applied to an unselected word line based on the inhibit control signal CTRL_inh. In the present exemplary embodiment, a voltage level of at least one of the first and second inhibit voltages Vinhy and Vinhx may be changed adaptively with respect to a variation in the voltage level of the selected bit line or the selected word line connected to the write/read circuit 120.

In one exemplary embodiment, the inhibit voltage generator 140 detects a voltage level of the selected bit line or the selected word line, and adjusts the voltage level of at least one of the first and second inhibit voltages Vinhy and Vinhx based on the detected voltage level. To do this, the inhibit voltage generator 140 may include a voltage detector 141. The voltage detector 141 may detect a node voltage at the connection node between the selected bit line or the selected word line and the write/read circuit 120.

In the present exemplary embodiment, the voltage detector 141 is included in the inhibit voltage generator 140, but it may also be formed as a separate functional block from the inhibit voltage generator 140.

As described above, the memory device 100 according to the present exemplary embodiment of the inventive concept detects the voltage level of the selected bit line or the selected word line when the write operation is performed with respect to the memory device 100, and adjusts the inhibit voltage based on the detected voltage level so that the leakage current occurring in the unselected memory cell may be reduced even if the node voltage at the connection node between the selected signal line, that is, the selected bit line or the selected word line, and the write circuit is changed due to the increase in the write pulses.

Also, the memory device 100 reduces the leakage current that may occur in the unselected memory cell, and accordingly, the set current provided from the write circuit may be stably supplied to the selected memory cell, and controllability of the cell current flowing in the selected memory cell may be improved.

Figure 3:
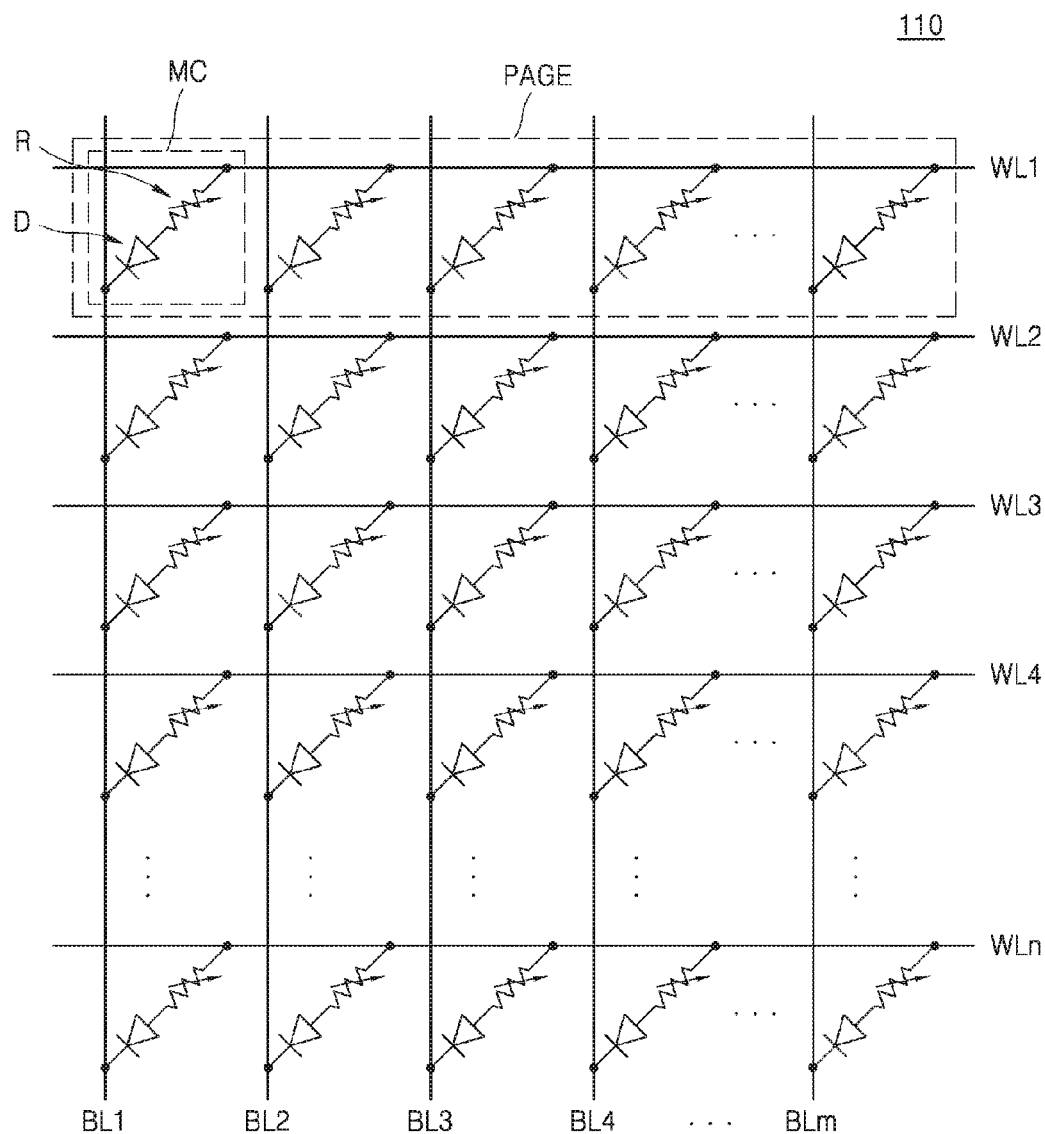
FIG. 3 is a detailed circuit diagram of a memory cell array of FIG. 2.

FIG. 3 is a circuit diagram of an example of the memory cell array 110 of FIG. 2.

Referring to FIG. 3, the memory cell array 110 may include the memory cells of a horizontal structure, for example. The memory cell array 110 may include a plurality of word lines WL1 through WLn, a plurality of bit lines BL1 through BLm, and a plurality of memory cells MCs. A group of the memory cells MC selected by the same word line WL may be defined as a page PAGE. Here, the number of word lines WL, the number of bit lines BL, and the number of memory cells MC may vary depending on exemplary embodiments. FIG. 3 shows a 2D memory of a horizontal structure, but one or more embodiments of the inventive concept are not limited thereto. That is, the memory cell array 110 may be a 3D memory of a vertical structure according to another embodiment.

According to the present exemplary embodiment, each of the plurality of memory cells MC may include a variable resistive device R and a selection device D. Here, the variable resistance device R may be referred to as a variable resistance material, and the selection device D may be referred to as a switching device.

In the present exemplary embodiment, the variable resistance device R is connected between one of the plurality of bit lines BL1 through BLm and the selection device D, and the selection device D may be connected between the variable resistance device R and one of the plurality of word lines WL1 through WLn. However, the one or more exemplary embodiments of the present inventive concept are not limited thereto, that is, the selection device D may be connected between one of the plurality of bit lines BL1 through BLm and the variable resistance device R, and the variable resistance device R may be connected between the selection device D and one of the plurality of word lines WL1 through WLn.

According to the present exemplary embodiment, the variable resistance device R may be switched to one of a plurality of resistance states by an electric pulse applied thereto. In the present exemplary embodiment, the variable resistance device R may include a phase-change material, a crystallization status of which varies depending on an amount of electric current. The phase-change material may vary, and may be, for example, GaSb, InSb, InSe, $Sb_2Te_3$, or GeTe that are compounds of two elements, GeSbTe, GaSeTe, InSbTe, $SnSb_2Te_4$, or InSbGe that are compounds of three elements, and AgInSbTe, (GeSn)SbTe, GeSb(SeTe), or $Te_{81}Ge_{15}Sb_2S_2$ that are compounds of four elements.

The phase-change material may have an amorphous state having a relatively high resistance and a crystalline state having a relatively low resistance. The phase of the phase-change material may be changed by Joule's heat generated according to the amount of electric current. In addition, the data may be written by using the phase change.

In addition, according to another exemplary embodiment of the present inventive concept, the variable resistance device R may include perovskite compounds, transmission metal oxide, magnetic materials, ferromagnetic materials, or antiferromagnetic materials, instead of the phase-change material.

The selection device D may control supply of the electric current to the variable resistance device R according to a voltage applied to the connected word line and the bit line. In the present exemplary embodiment, the selection device D may be a PN junction diode or a PIN junction diode. An anode of the diode may be connected to the variable resistance device R and a cathode of the diode may be connected to one of the plurality of bit lines BL1 through BLm. Here, if a voltage difference between the anode and the cathode of the diode, that is, the selection device D, becomes greater than a threshold voltage of the diode, the diode is turned on so as to supply the electric current to the variable resistance device R. In FIG. 3, the selection device D is shown as a diode; however, one or more exemplary embodiments of the inventive concept are not limited thereto, that is, the selection device D may be another device that may be switched.

Figure 4:
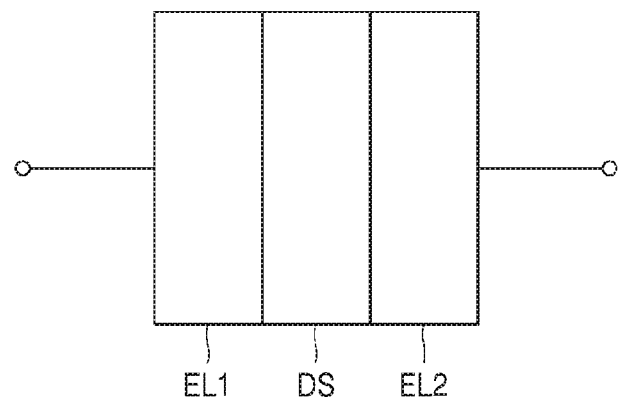
FIG. 4 is a diagram of an example of a variable resistor device included in the memory cell of FIG. 3.

FIG. 4 is a diagram of the variable resistance device R included in the memory cell MC of FIG. 3. Referring to FIG. 4, the variable resistance device R includes first and second electrodes EL1 and EL2, and a data storage film DS disposed between the first and second electrodes EL1 and EL2.

The first and second electrodes EL1 and EL2 may be formed of various metals, metal oxides, or metal nitrides. The first and second electrodes EL1 and EL2 may be formed of aluminium (Al), copper (Cu), titanium nitride (TiN), titanium aluminium nitride (TixAlyNz), iridium (Ir), platinum (Pt), silver (Ag), gold (Au), poly silicon, tungsten (W), titanium (Ti), tantalum (Ta), tantalum nitride (TaN), tungsten nitride (WN), nickel (Ni), cobalt (Co), chrome (Cr), antimony (Sb), iron (Fe), molybdenum (Mo), palladium (Pd), tin (Sn), zirconia (Zr), zinc (Zn), iridium oxide ($IrO_2$), or strontium zirconate oxide ($StZrO_3$).

The data storage film DS may be a bipolar resistive memory material or a unipolar resistive memory material. The bipolar resistive memory material may be programmed as a set state or a reset state according to a polarity of the pulse, and the unipolar resistive memory material may be a perovskite-based material. In addition, the unipolar resistive memory material may be programmed as a set state or a reset state according to the pulses of the same polarity, and the unipolar resistive memory material may be a transition metal oxide such as NiOx or TiOx.

Figure 5A:
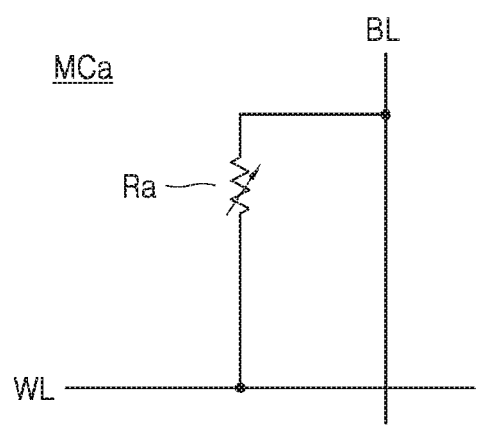
FIGS. 5A through 5C are circuit diagrams showing modified examples of the memory cell of FIG. 3.
Figure 5B:
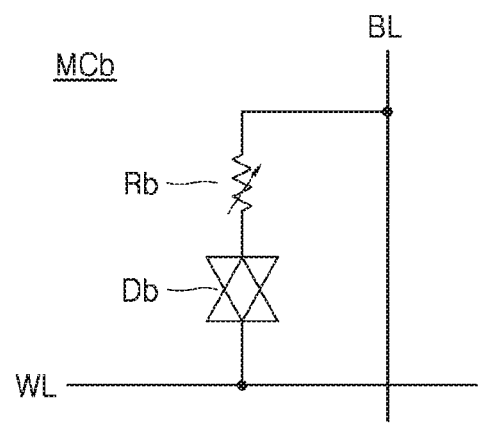
Figure 5C:
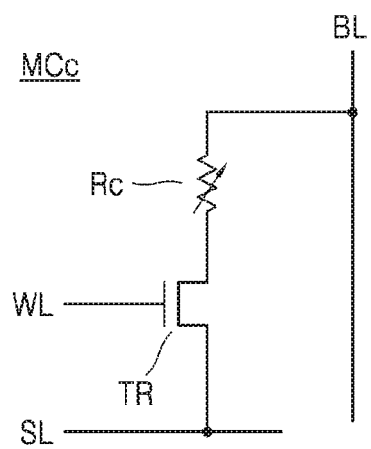

FIGS. 5A through 5C are circuit diagrams showing modified examples of the memory cell MC shown in FIG. 3.

Referring to FIG. 5A, a memory cell MCa includes a variable resistance device Ra, and the variable resistance device Ra may be connected between a bit line BL and a word line WL. The memory cell MCa may store data by using voltages applied to the bit line BL and the word line WL.

Referring to FIG. 5B, a memory cell MCb may include a variable resistance device Rb and a bidirectional diode Db. The variable resistance device Rb may include a resistor material for storing data. The bidirectional diode Db is connected between the variable resistance device Rb and the word line WL, and the variable resistance device Rb may be connected between the bit line BL and the bidirectional diode Db. Locations of the bidirectional diode Db and the variable resistance device Rb may be exchanged. A leakage current flowing in unselected resistor cells may be blocked by the bidirectional diode Db.

Referring to FIG. 5C, a memory cell MCc may include a variable resistance device Rc and a transistor TR. The transistor TR may be a selection device for supplying or blocking the electric current to the variable resistance device Rc according to a voltage of the word line WL, that is, a switching device. The transistor TR is connected between the variable resistance device Rc and the source line SL, and the variable resistance device Rc may be connected between the bit line BL and the transistor TR. Locations of the transistor TR and the variable resistance device Rc may be exchanged. The memory cell MCc may be selected or may not be selected according to turning on/turning off of the transistor TR that is driven by the word line WL.

Figure 6:
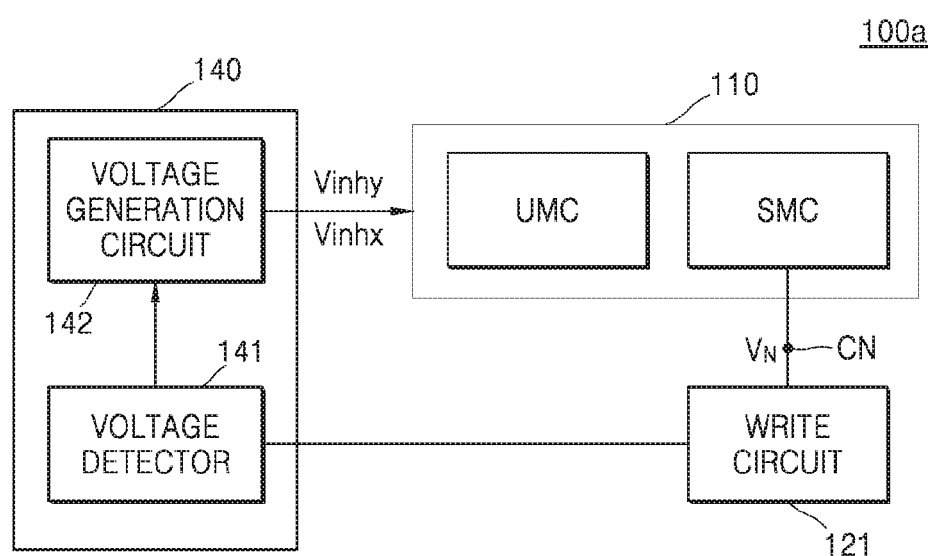
FIG. 6 is a block diagram of a memory device including an inhibit voltage generator according to an exemplary embodiment of the inventive concept.

FIG. 6 is a block diagram of a memory device 100a including the inhibit voltage generator 140 according to an exemplary embodiment of the inventive concept.

Referring to FIG. 6, the memory device 100a may include the memory cell array 110, the write circuit 121, and the inhibit voltage generator 140. The memory device 100a of the present exemplary embodiment is a modified example of the memory device 100 of FIG. 2, and descriptions about the memory device 100 with reference to FIG. 2 may be applied to the present exemplary embodiment. Also, although not shown in FIG. 6, the elements included in the memory device 100 of FIG. 2 may be also included in the memory device 100a according to the present exemplary embodiment.

The memory cell array 110 may include a selected memory cell SMC and an unselected memory cell UMC. The selected memory cell SMC may be connected to the write/read circuit 120, and the unselected memory cell UMC may be connected to the inhibit voltage generator 140 to receive first and second inhibit voltages Vinhx and Vinhy.

The inhibit voltage generator 140 may include the voltage detector 141 and a voltage generation circuit 142. The voltage generator 141 may detect a voltage level of a selected bit line or a selected word line that is connected to the selected memory cell SMC. The voltage generation circuit 142 generates the first and second inhibit voltages Vinhx and Vinhy and may change the voltage level of at least one of the first and second inhibit voltages Vinhx and Vinhy based on the detected voltage level.

As described above with reference to FIGS. 1 and 2, the voltage of the selected bit line or the selected word line connected to the selected memory cell SMC may be increased or reduced as the number of times the programming loops are performed increases. That is, a node voltage $V_N$ at a connection node CN between the selected memory cell SMC and the write circuit 121 may be increased or reduced as the number of times the programming loops are performed increases.

The voltage detector 141 detects the node voltage $V_N$ at the connection node CN to detect the voltage level of the selected first signal line or the selected second signal line. As an example, the selected first signal line may be a selected bit line, and the selected second signal line may be a selected word line. The voltage detector 141 may provide the detected node voltage $V_N$ to the voltage generation circuit 142.

In one exemplary embodiment, the voltage detector 141 may detect the node voltage $V_N$ at the connection node CN based on a voltage of at least one node of the write circuit 121 provided from the write circuit 121.

In one exemplary embodiment, the voltage detector 141 may detect the node voltage $V_N$ at the connection node CN while the verification operation is performed in each of the programming loops. In another exemplary embodiment, the voltage detector may detect the node voltage $V_N$ at the connection node CN, right after the programming operation in each of the programming loops, without regard to the verification operation.

The voltage generation circuit 142 may change the voltage level of at least one of the first and second inhibit voltages Vinhx and Vinhy according to variation in the detected node voltage $V_N$, that is, variation in the voltage of the selected bit line or the selected word line.

If the node voltage $V_N$ is a voltage at a node between the selected bit line and the write circuit 121, the voltage generation circuit 142 may change the voltage level of the second inhibit voltage Vinhx. If the node voltage $V_N$ is reduced, the voltage generation circuit 142 adjusts the voltage level of the second inhibit voltage Vinhx to be reduced, and if the node voltage $V_N$ increases, the voltage generation circuit 142 may adjust the voltage level of the second inhibit voltage Vinhx to be increased. Moreover, the voltage generation circuit 142 may change the voltage level of the first inhibit voltage Vinhy according to the change in the second inhibit voltage Vinhx.

As another example, if the node voltage $V_N$ is a voltage at a node between the selected word line and the write circuit 121, the voltage generation circuit 142 may change the voltage level of the first inhibit voltage Vinhy. If the node voltage $V_N$ is reduced, the voltage generation circuit 142 adjusts the voltage level of the first inhibit voltage Vinhy to be reduced, and if the node voltage $V_N$ is increased, the voltage generation circuit 142 may adjust the voltage level of the first inhibit voltage Vinhy to be increased. Moreover, the voltage generation circuit 142 may change the voltage level of the second inhibit voltage Vinhx according to the change in the first inhibit voltage Vinhx.

In one exemplary embodiment, the voltage generation circuit 142 may generate the first or second inhibit voltage Vinhy or Vinhx by using the voltage level of the node voltage $V_N$ as a reference voltage. The voltage generation circuit 142 may continuously increase or decrease the first or second inhibit voltage Vinhy or Vinhx with respect to the change in the node voltage $V_N$.

In another exemplary embodiment, the voltage generation circuit 142 may generate a plurality of first or second inhibit voltages Vinhy or Vinhx having a plurality of voltage levels that are set in advance, and may select and output the first or second inhibit voltage Vinhy or Vinhx, from among the plurality of first or second inhibit voltages Vinhy or Vinhx, corresponding to the voltage level of the node voltage $V_N$.

Figure 7:
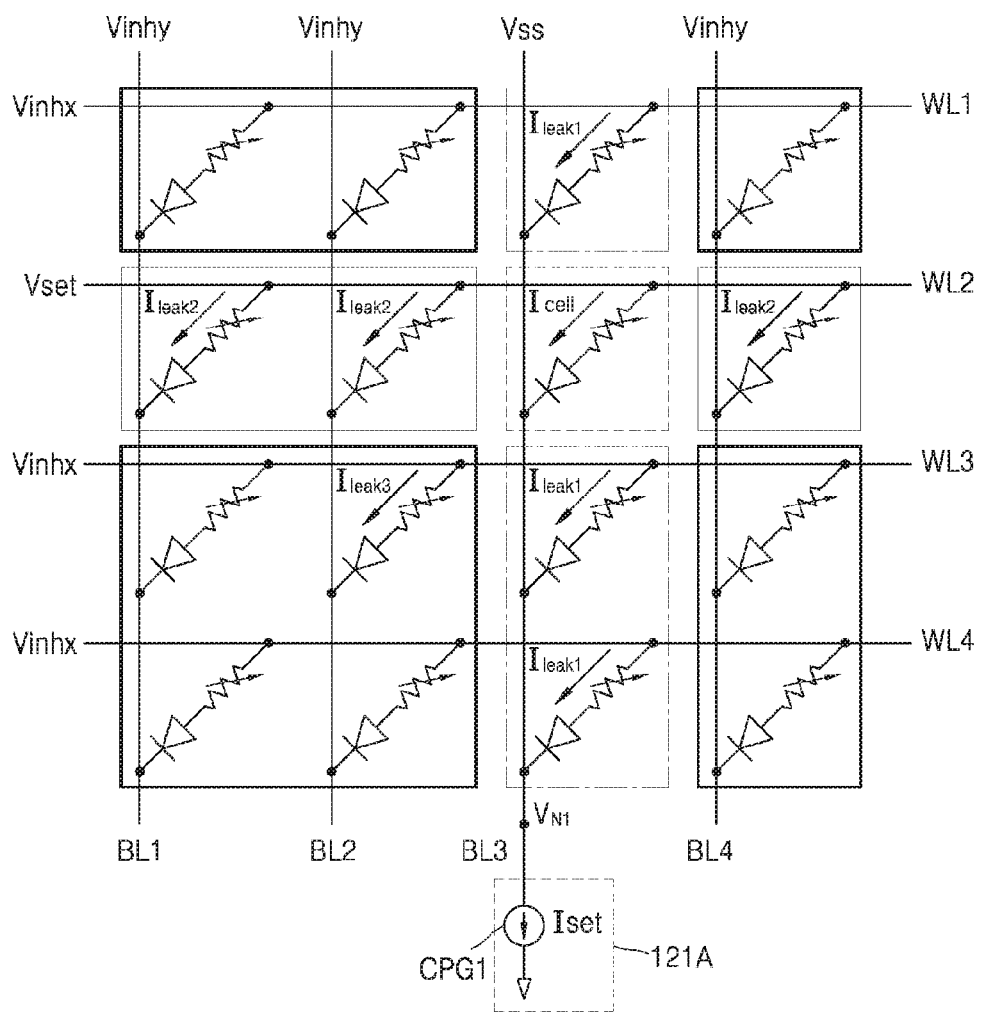
FIG. 7 is a circuit diagram showing connection relations between a memory cell array and a write circuit when a set writing operation is performed according to an exemplary embodiment of the inventive concept.

FIG. 7 is a circuit diagram showing a connection relation between a memory cell array 110A and a write circuit 121A, when a set write operation is performed according to an exemplary embodiment of the inventive concept.

Referring to FIG. 7, the write circuit 121A may include a current pulse generator CPG1, and the current pulse generator CPG1 may generate a set current Iset, an amplitude or a pulse width of which is increased according to the number of times the programming loops are performed. The write circuit 121A may be connected to the selected bit line, for example, a third bit line BL3, and may provide the set current Iset to the selected memory cell SMC via the selected bit line. Accordingly, the set write operation may be performed so that the resistance of the selected memory cell SMC is reduced. Here, supplying of the set current Iset may denote sinking or sourcing the set current Iset.

Here, as shown in FIG. 7, if the selected bit line is the third bit line BL3 and the selected word line is a second word line WL2, first, second, and fourth bit lines BL1, BL2, and BL4 may be unselected bit lines and first, third, and fourth word lines WL1, WL3, and WL4 may be unselected word lines.

Hereinafter, memory cells arranged on regions where the unselected word lines WL1, WL3, and WL4 and the selected bit line BL3 cross each other may be referred to as first unselected memory cells UMC1. The first unselected memory cells UMC1 may be also referred to as half-selected memory cells. Here, a leakage current that may occur in the first unselected memory cells UMC1 may be referred to as a first leakage current Ileak1.

Also, memory cells arranged on regions where the unselected bit lines BL1, BL2, and BL4 and the selected word line WL2 cross each other may be referred to as second unselected memory cells UMC2. The second unselected memory cells UMC2 may be also referred to as half-selected memory cells. Here, a leakage current that may occur in the second unselected memory cells UMC2 may be referred to as a second leakage current Ileak2.

In addition, memory cells arranged on regions where the unselected bit lines BL1, BL2, and BL4 and the unselected word lines WL1, WL3, and WL4 cross each other may be referred to as third unselected memory cells UMC3. Here, a leakage current that may occur in the third unselected memory cells UMC3 may be referred to as a third leakage current Ileak3.

Figure 8A:
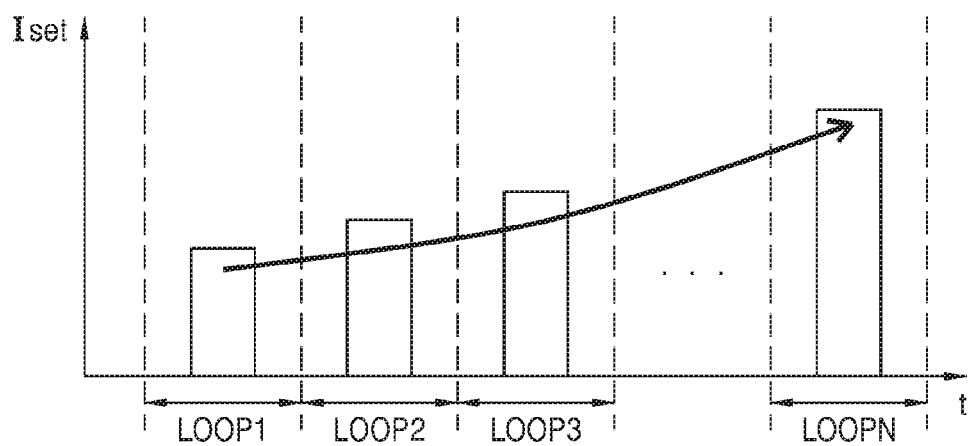
FIG. 8A is a graph showing an example of a set current provided from the write circuit of FIG. 7.

FIG. 8A is a graph showing an example of the set current Iset provided from the write circuit 121A of FIG. 7.

Referring to FIG. 8A, a horizontal axis denotes time and a vertical axis denotes the set current Iset. In the present exemplary embodiment, the set current Iset may include a plurality of pulses having amplitudes that are gradually increased as the number of times the programming loops are performed increases. However, one or more exemplary embodiments of the inventive concept are not limited thereto, and in another exemplary embodiment, the set current Iset may include a plurality of pulses having pulse widths that are gradually increased as the number of times the programming loops are performed increases. Also, in another exemplary embodiment, the set current Iset may include a plurality of pulses having amplitudes or pulse widths that are non-linearly increased as the number of times the programming loops are performed increases.

Figure 8B:
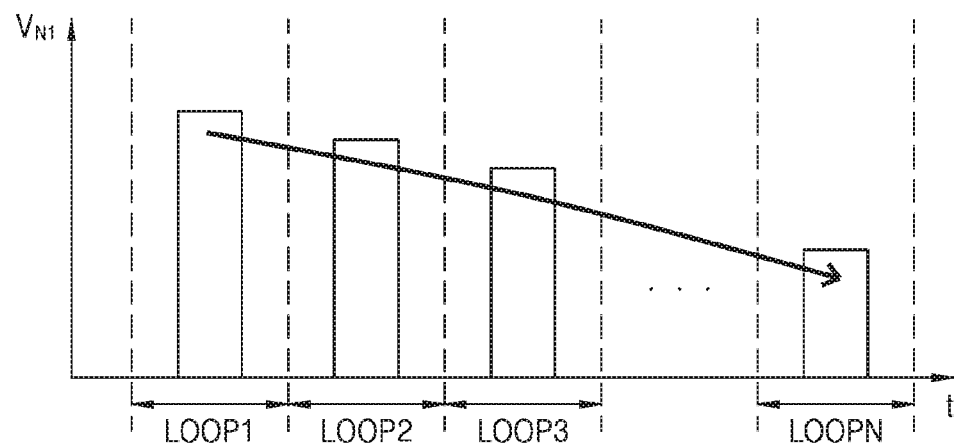
FIG. 8B is a graph showing an example of a node voltage at a connection node between the write circuit of FIG. 7 and a bit line.

FIG. 8B is a graph showing an example of a node voltage $V_{N1}$ at the connection node CN between the write circuit 121A of FIG. 7 and the selected bit line. The node voltage $V_{N1}$ may be substantially the same as a voltage of the selected bit line.

Referring to FIG. 8B, a horizontal axis denotes time and a vertical axis denotes a voltage $V_{N1}$ at the connection node CN1 between the write circuit 121A and the selected bit line. In the present exemplary embodiment, as the set current Iset increases, the node voltage $V_{N1}$ at the connection node CN1 between the write circuit 121A and the selected bit line is reduced. That is, the node voltage $V_{N1}$ of the connection node CN1 is changed in inverse-proportion to the set current Iset.

Therefore, if the second inhibit voltage Vinhx applied to the unselected word lines WL1, WL3, and WL4 are constant, the voltage difference between the node voltage $V_{N1}$ of the connection node CN1 and the second inhibit voltage Vinhx increases. Accordingly, the first leakage current Ileak1 that may occur in the first unselected memory cells UMC1 arranged on the regions where the unselected word lines WL1, WL3, and WL4 and the selected bit line BL3 cross each other may be increased.

Figure 9:
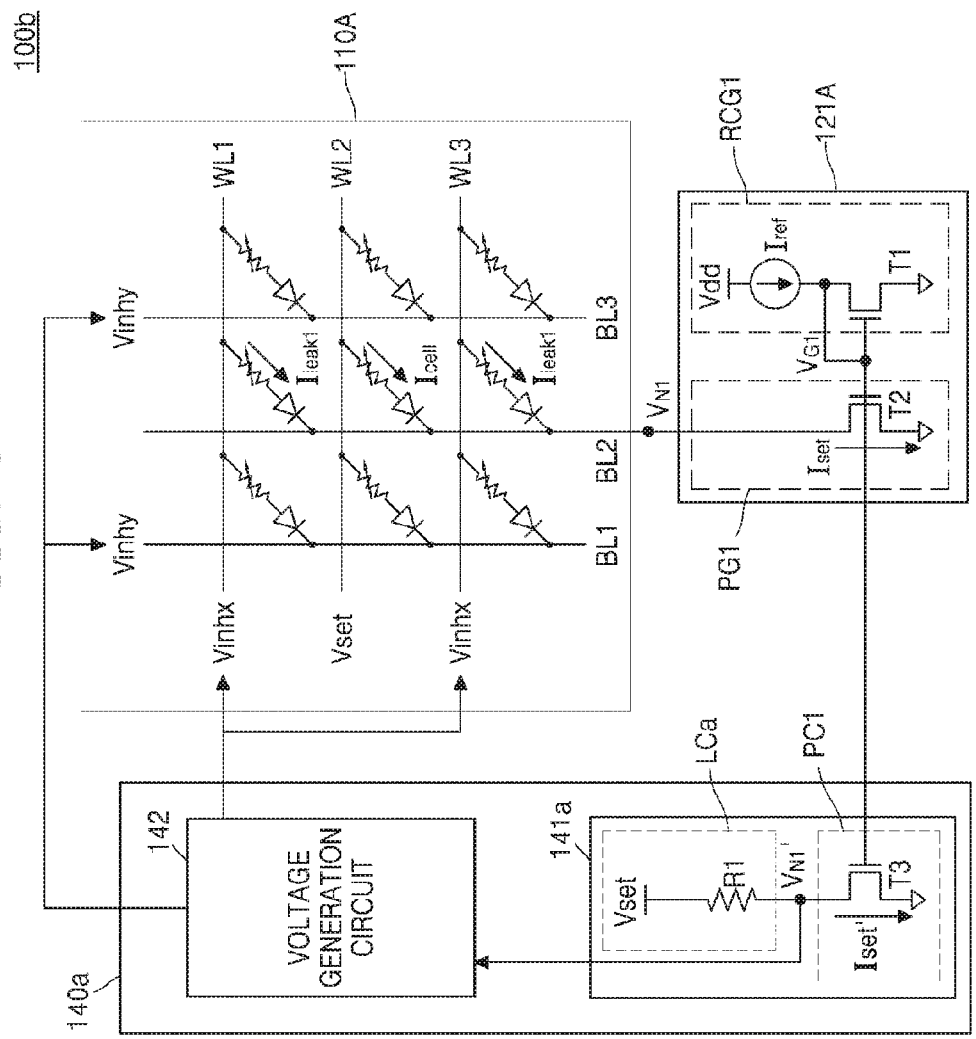
FIG. 9 is a schematic circuit diagram of a memory device including an inhibit voltage generator according to an exemplary embodiment of the inventive concept.

FIG. 9 is a schematic circuit diagram of a memory device 100b including an inhibit voltage generator 140a according to an exemplary embodiment of the inventive concept.

Referring to FIG. 9, the memory device 100b may include the memory cell array 110A, the write circuit 121A, and the inhibit voltage generator 140a. The inhibit voltage generator 140a may include a voltage detector 141a and the voltage generation circuit 142.

The memory device 100b of the present exemplary embodiment is a modified example of the memory device 100 of FIG. 6, and thus, descriptions with reference to FIG. 6 may be applied to the present exemplary embodiment.

The write circuit 121A may include a reference current generator RCG1 generating a reference current Iref and a pulse generator PG1 generating current pulses based on the reference current Iref. The pulse generator PG1 may generate the set current Iset. A first transistor T1 of the reference current generator RCG1 and a second transistor T2 of the pulse generator PG1 may form a current mirror circuit. The first transistor T1 and the second transistor T2 may be formed as NMOS transistors.

When the reference current Iref flows through the first transistor T1, a drain voltage of the first transistor T1 is applied to the first transistor T1 and the second transistor T2 as a gate voltage VG1. The current flowing in the second transistor T2 may be proportional to the reference current Iref.

The voltage detector 141a detects the voltage level of the node voltage $V_{N1}$, and may provide the detected voltage level to the voltage generation circuit 142. The voltage detector 141a according to the present exemplary embodiment may include a pulse copy unit PC1 and a load circuit LCa.

The pulse copy unit PC1 may generate a current pulse Iset' (hereinafter, referred to as a copy pulse) that is substantially equal to the current pulse generated by the write circuit 121A, for example, the set current Iset. The pulse copy unit PC1 may be a current mirroring circuit that mirrors the reference current Iref of the write circuit 121A to generate the copy pulse Iset'. The pulse copy unit PC1 may be substantially the same as the pulse generator PG1 of the write circuit 121A. The pulse copy unit PC1 may include a third transistor T3, and a size of the third transistor T3 (for example, a width and a length of the transistor) may be equal to that of the second transistor T2 in the pulse generator PG1. The third transistor T3 may be an NMOS transistor.

The pulse copy unit PC1 receives the gate voltage VG1 from the write circuit 121A, and may generate the copy pulse Iset' based on the gate voltage VG1. Since the size of the third transistor T3 is equal to that of the second transistor T2 and the same gate voltage VG1 is applied to the gates of the third transistor T3 and the second transistor 2, the current value of the copy pulse Iset' may be equal to that of the set current Iset.

The load circuit LCa is connected to the pulse copy unit PC1, and may receive the copy pulse Iset' from the pulse copy unit PC1. The copy pulse Iset' may flow through the load circuit LCa. As shown in the drawings, the load circuit LCa may include a resistor R1. An end of the resistor R1 is connected to the pulse copy unit PC1, and a set voltage Vset may be applied to the other end of the resistor R1.

A resistance value of the resistor R1 may be obtained by modelling resistance components of the selected memory cell, the selected word line, and the selected bit line. For example, the resistance value of the resistor R1 may be set to correspond to the resistance components of the selected memory cell, the selected word line, and the selected bit line that are experimentally extracted.

As described above, since the resistance value of the resistor R1 is similar to the resistance components of the selected memory cell, the selected word line, and the selected bit line, and the currents of the same current values flow on the second transistor T2 of the write circuit 121A and the third transistor T3 of the voltage detector 141a, drain voltages of the second transistor T2 and the third transistor T3 may be equal to each other. Therefore, a node voltage $V_{N1}'$ at the connection node between the load circuit LCa and the pulse copy unit PC1 may be equal to the node voltage $V_{N1}$ at the connection node between the write circuit 121A and the selected bit line BL2. Accordingly, the voltage detector 141a may detect the voltage level of the node voltage $V_{N1}'$ at the connection node between the load circuit LCa and the pulse copy unit PC1 as the voltage level of the node voltage $V_{N1}$ at the connection node between the write circuit 121A and the selected bit line.

The voltage generation circuit 142 may change the voltage level of the second inhibit voltage Vinhx based on the detected node voltage $V_{N1}$. As described above with reference to FIGS. 8A and 8B, the write circuit 121A may provide the set current Iset that increases according to the number of times the programming loops are performed. Accordingly, the node voltage $V_{N1}$ at the connection node between the selected bit line BL2 and the write circuit 121A may be reduced as the number of times the programming loops are performed increases. The voltage generation circuit 142 may reduce the voltage level of the second inhibit voltage Vinhx to correspond to the reduction in the voltage level of the node voltage $V_{N1}$ to prevent the increase in the leakage current Ileak1 in the memory cells connected to the unselected word lines WL1 and WL3 and the selected bit line BL2. The voltage generation circuit 142 may reduce the voltage level of the second inhibit voltage Vinhx continuously or discretely according to the reduction in the node voltage $V_{N1}$. Moreover, the voltage generation circuit 142 may adjust the voltage level of the first inhibit voltage Vinhy so that the voltage difference between the unselected bit lines BL1 and BL3 and the selected word line WL2 is maintained constantly.

Figure 10:
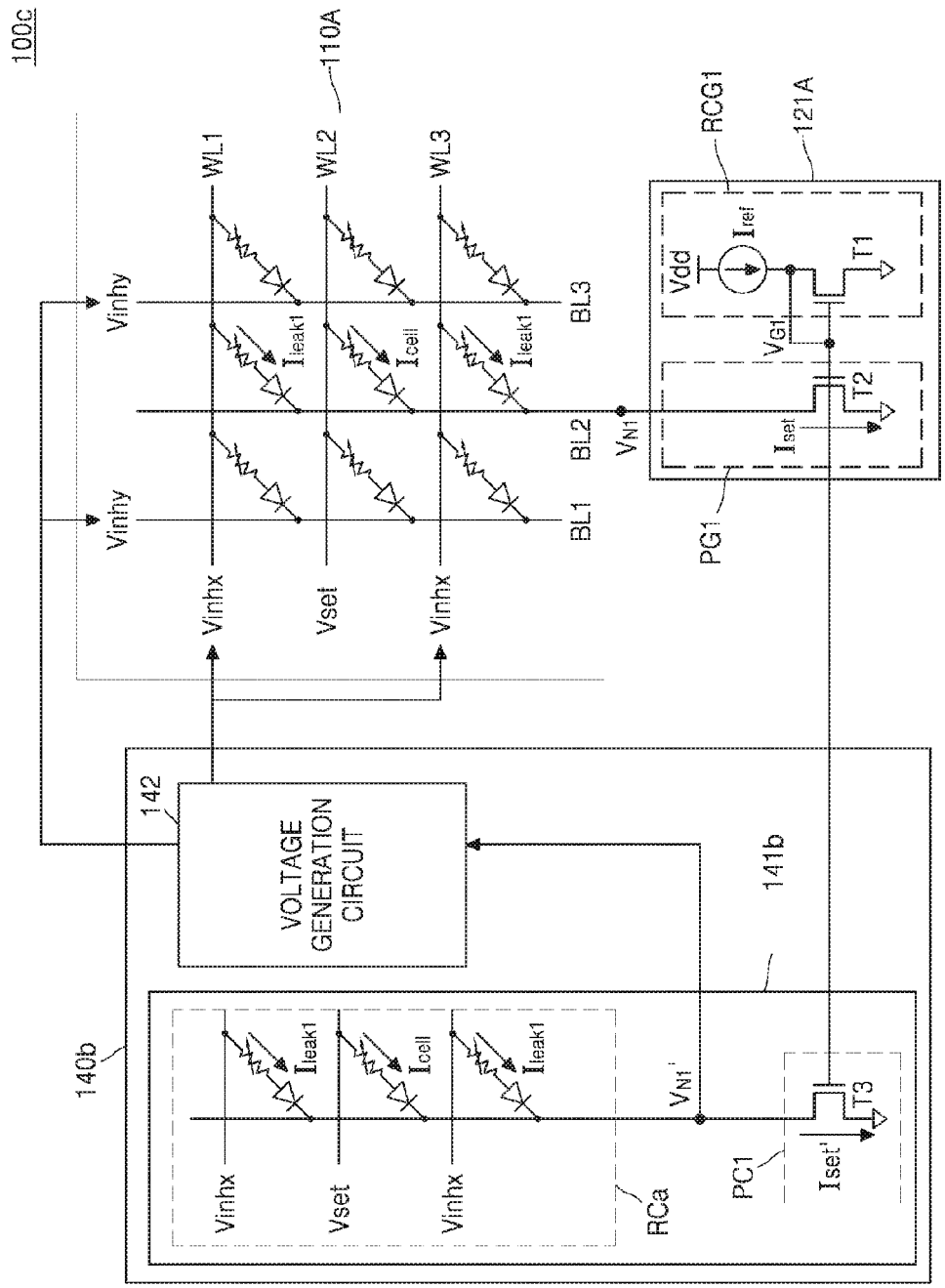
FIG. 10 is a schematic circuit diagram of a memory device including an inhibit voltage generator according to another exemplary embodiment of the inventive concept.

FIG. 10 is a circuit diagram of a memory device 100c including an inhibit voltage generator 140b according to another exemplary embodiment of the inventive concept. The inhibit voltage generator 140b of FIG. 10 is a modified example of the inhibit voltage generator 140a of FIG. 9. Therefore, descriptions about the elements that are described above are omitted, and elements that are different from those of the inhibit voltage generator 140a of FIG. 9 will be described below.

Referring to FIG. 10, the voltage detector 141b may include the pulse copy unit PC1 and a reference cell array RCa. The reference cell array RCa may correspond to the load circuit LCa of FIG. 9, and the copy pulse Iset' may flow through the reference cell array RCa.

The reference cell array RCa may include reference cells corresponding to the memory cells that are included in at least one row or column in the memory cell array 110A. For example, as shown in FIG. 10, the reference cell array RCa may include the memory cells corresponding to one column of the memory cell array 110A. The reference cells may correspond to the memory cells connected to the selected bit line BL2, and voltages applied to the corresponding memory cells may be applied respectively to the reference cells. Therefore, the copy pulse Iset' that is equal to the set current Iset may flow through the reference cell array RCa, and a node voltage $V_{N1}'$ at a connection node between the reference cell array RCa and the pulse copy unit PC1 may be equal to the node voltage $V_{N1}$ at the connection node between the write circuit 121A and the selected bit line BL2.

Figure 11:
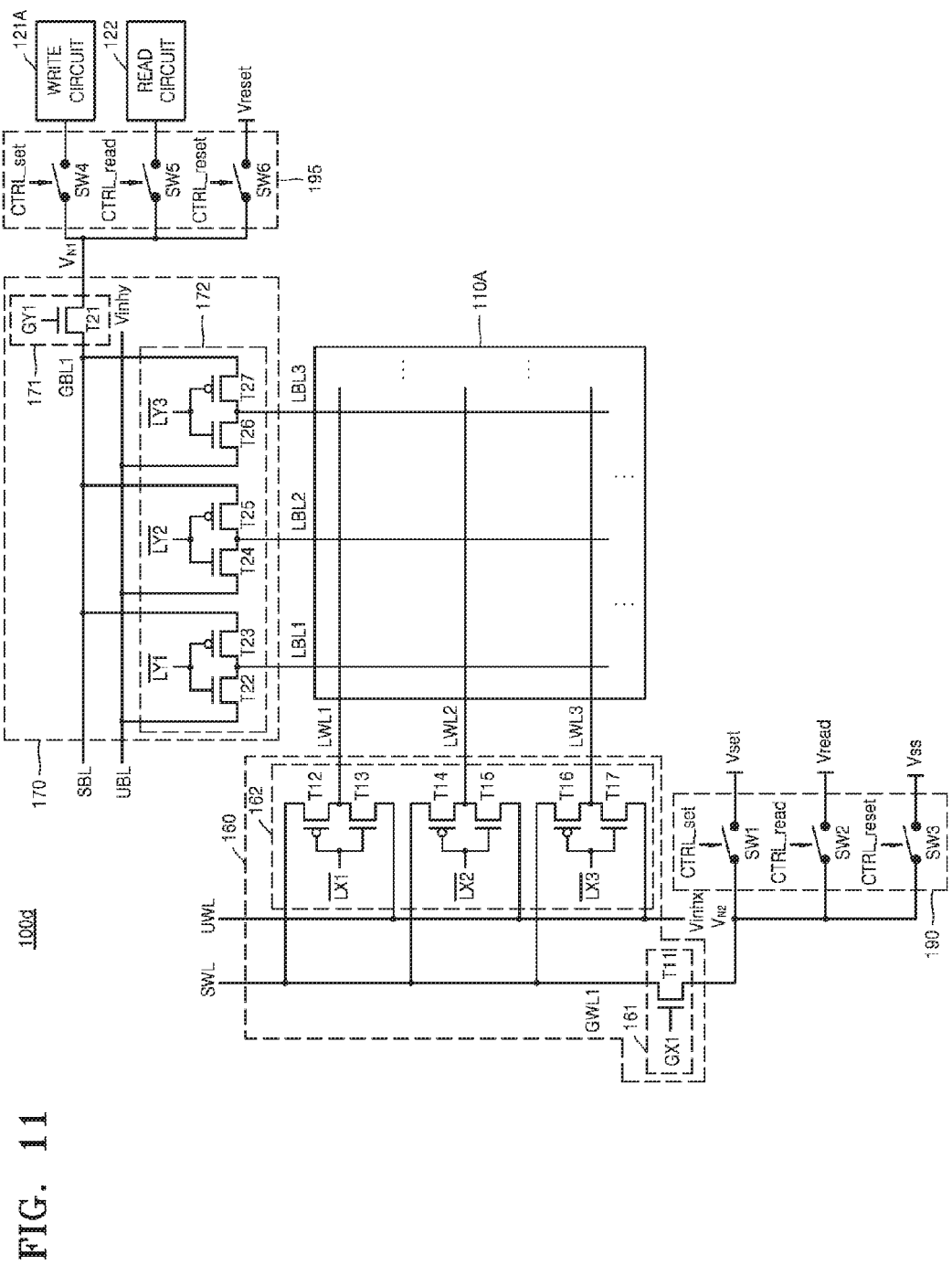
FIG. 11 is a circuit diagram of a memory device including the memory cell array and the write circuit of FIG. 7.

FIG. 11 is a circuit diagram of a memory device 100d including the memory cell array 110A and the write circuit 121A of FIG. 7.

Referring to FIG. 11, the memory device 100d may include the memory cell array 110A, the write circuit 121A, the read circuit 122, the row decoder 160, the column decoder 170, and first and second switching units 190 and 195. The memory device 100d according to the present exemplary embodiment is a modified example of the memory device 100 of FIG. 2, and thus, descriptions above with reference to FIG. 2 may be applied to the present exemplary embodiment. Also, although not shown in FIG. 11, the elements included in the memory device 100 of FIG. 2 may be also included in the memory device 100d according to the present exemplary embodiment.

The row decoder 160 may include a first row decoder 161 and a second row decoder 162. The first row decoder 161 may activate a first global word line GWL1 in response to a first global row address GX1. The first row decoder 161 may include a transistor T11, and may be referred to as a global row switch. For example, if the first global row address GX1 is 1, the first row decoder 161 may connect the first global row word line GWL1 to the first switching unit 190.

The second row decoder 162 may activate first to third local word lines LWL1, LWL2, and LWL3 in response to first to third local row addresses LX1, LX2, and LX3. The first to third local word lines LWL1-LWL3 may correspond to the word lines WL1 to WLm of FIG. 3. The second row decoder 162 may include transistors T12 to T17, and may be referred to as a local row switch. For example, if the local row address LX1 is '1', the transistor T12 is turned on and the transistor T13 is turned off. As such, the first local word line LWL1 becomes the selected word line SWL and is connected to the first switching unit 190. In addition, if the local row address LX1 is '0', the transistor T12 is turned off and the transistor T13 is turned on. As such, the first local word line LWL1 becomes an unselected word line UWL to receive the second inhibit voltage Vinhx.

The first switching unit 190 may include first to third switches SW1, SW2, and SW3. The first switch SW1 is turned on/off according to the set selection signal CTRL_set to connect the voltage generator 150 (see FIG. 2) to the first global word line GWL1, and then, the set voltage Vset may be applied to the first global word line GWL1. The second switch SW2 is turned of/off according to a read selection signal CTRL_read to connect the voltage generator 150 to the first global word line GWL1, and accordingly, the read voltage Vread may be applied to the first global word line GWL1. The third switch SW3 is turned on/off according to a reset selection signal CTRL_reset to connect the voltage generator 150 to the first global word line GWL1, and accordingly, a ground voltage Vss may be applied to the first global word line GWL1. Here, the set selection signal CTRL_set, the read selection signal CTRL_read, and the reset selection signal CTRL_reset may be provided from the control logic 130.

The column decoder 170 may include a first column decoder 171 and a second column decoder 172. The first column decoder 171 may activate a first global bit line GBL1 in response to a first global column address GY1. The first column decoder 171 may include a transistor T21, and may be referred to as a global column switch. For example, if the first global column address GY1 is '1', the first column decoder 171 may connect the first global bit line GBL1 to the second switching unit 195.

The second column decoder 172 may activate first to third local bit lines LBL1, LBL2, and LBL3 in response to first to third local column addresses LY1, LY2, and LY3. The first to third local bit lines LBL1, LBL2, and LBL3 may correspond to the bit lines BL1 to BLn of FIG. 3. The second column decoder 172 may include transistors T21 to T27, and may be referred to as a local column switch. For example, if the local column address LY1 is '1', the transistor T22 is turned on and the transistor T23 is turned off. As such, the first local bit line LBL1 becomes the selected bit line SBL and is connected to the second switching unit 195. In addition, if the local column address LY1 is '0', the transistor T22 is turned off and the transistor T23 is turned on. As such, the first local bit line LBL1 becomes the unselected bit line UBL to receive the first inhibit voltage Vinhy.

The second switching unit 195 may include fourth to sixth switches SW4, SW5, and SW6. The fourth switch SW4 is turned on/off according to the set selection signal CTRL_set to connect the write circuit 121A to the first global bit line GBL1. The fifth switch SW5 is turned on/off according to the read selection signal CTRL_read to connect the read circuit 122 to the first global bit line GBL1. The sixth switch SW6 is turned on/off according to the reset selection signal CTRL_reset to connect the voltage generator 150 to the first global bit line GBL1, as such, the reset voltage Vreset may be applied to the first global bit line GBL1. Here, the set selection signal CTRL_set, the read selection signal CTRL_ read, and the reset selection signal CTRL_read may be provided from the control logic 130.

Figure 12:
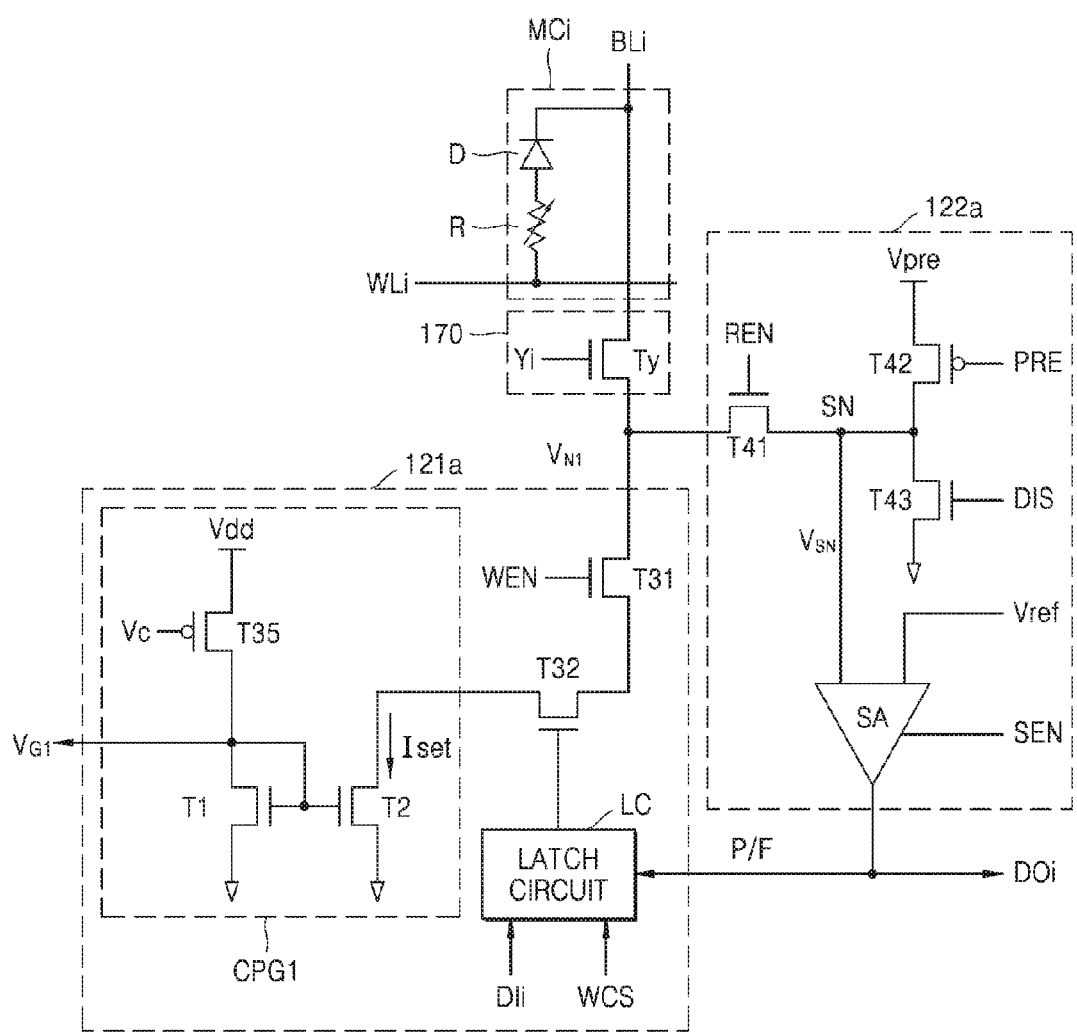
FIG. 12 is a detailed circuit diagram showing an example of the write circuit of FIGS. 9 and 10.

FIG. 12 is a circuit diagram of an example of the write circuit 121A of FIGS. 9 and 10 in more detail.

Referring to FIG. 12, a memory cell MCi is arranged on a region where a bit line BLi and a word line WLi cross each other, and may include a variable resistive device R and a selection device D. The column decoder 170 may include a bit line selection transistor Ty, and the bit line selection transistor Ty may connect the memory cell MCi to a write circuit 121a or a read circuit 122a in response to the column address Yi. Hereinafter, a case in which the column address Yi is activated and the memory cell MCi and the write circuit 121a or the read circuit 122a are connected to each other will be described below.

The write circuit 121a may include transistors T31 and T32, a current pulse generator CPG1, and a latch circuit LC. In the present exemplary embodiment, a write enable signal WEN is activated, the transistor T31 is turned on, and accordingly, the write circuit 121a may be connected to the memory cell MCi.

The current pulse generator CPG1 may include transistors T1, T2, and T35. The transistors T1 and T2 may form a current mirror. In response to a control voltage Vc applied to a gate of the transistor T35, the transistor T35 may provide a current pulse, for example, a reference current. The set current Iset may be generated through the transistor T2 that is mirrored with the transistor T1.

The control voltage Vc may be increased as the number of times the programming loops are performed increases. Therefore, the current pulse generator CPG1 may provide the set current Iset that increases as the number of times the programming loops are performed increases. The set current Iset may be sunken from the bit line BLi connected to the memory cell MCi. In addition, a gate voltage VG1 of the transistor T1 may be provide to the voltage detector (141a of FIG. 9 and 141b of FIG. 10).

The latch circuit LC may output a gate voltage so that the transistor T32 may be selectively turned on according to a logic level of an input bit Dli, in response to the write control signal WCS. In one exemplary embodiment, if the write control signal WCS indicates the write operation in a set direction, the latch circuit LC may turn the transistor T32 on when the logic level of the input bit Dli is '0' and may turn the transistor T32 off when the logic level of the input bit Dli is '1'. In another exemplary embodiment, if the write control signal WCS indicates the write operation in a reset direction, the latch circuit LC may turn the transistor T32 off when the logic level of the input bit Dli is '0' and may turn the transistor T32 on when the logic level of the input bit Dli is '1'.

The read circuit 122a may include transistors T41, T42, and T43, and a sense amplifier SA. In the present exemplary embodiment, when a read enable signal REN is activated, the transistor T41 is turned on, and accordingly, the read circuit 122a may be connected to the memory cell MCi.

When a precharge signal PRE is activated, the transistor T42 is turned on and the bit line BLi may be precharged with the precharge voltage Vpre. In addition, when a discharge signal DIS is activated, the transistor T43 is turned on and the bit line BLi may be initialized to a ground voltage.

The sense amplifier SA is activated according to a sense enable signal SEN, and compares a voltage $V_{SN}$ at a sensing node SN with the reference voltage Vref and may provide an output bit DOi that represents whether the memory cell MCi is in turned-on state or turned-off state. In a general read operation, the output bit DOi may be provided to outside of the memory device 100, for example, the memory controller 200.

In addition, in a case of a verification read operation for determining whether the write operation is finished, the output bit DOi may be provided into the memory device 100, for example, to the latch circuit LC and the control logic 130, as a pass/fail (P/F) signal indicating whether to succeed or fail the write operation. If the P/F signal indicates that the write operation has finished, the latch circuit LC may turn the transistor T32 off to suspend the write operation on the memory cell MCi.

Although not shown in the drawings, in another exemplary embodiment, the write circuit 121a may further include a voltage pulse generator. The voltage pulse generator may receive the control voltage Vc provided from the voltage generator 150, and may generate a voltage pulse corresponding to the control voltage Vc to provide the voltage pulse to the memory cell MCi.

Figure 13:
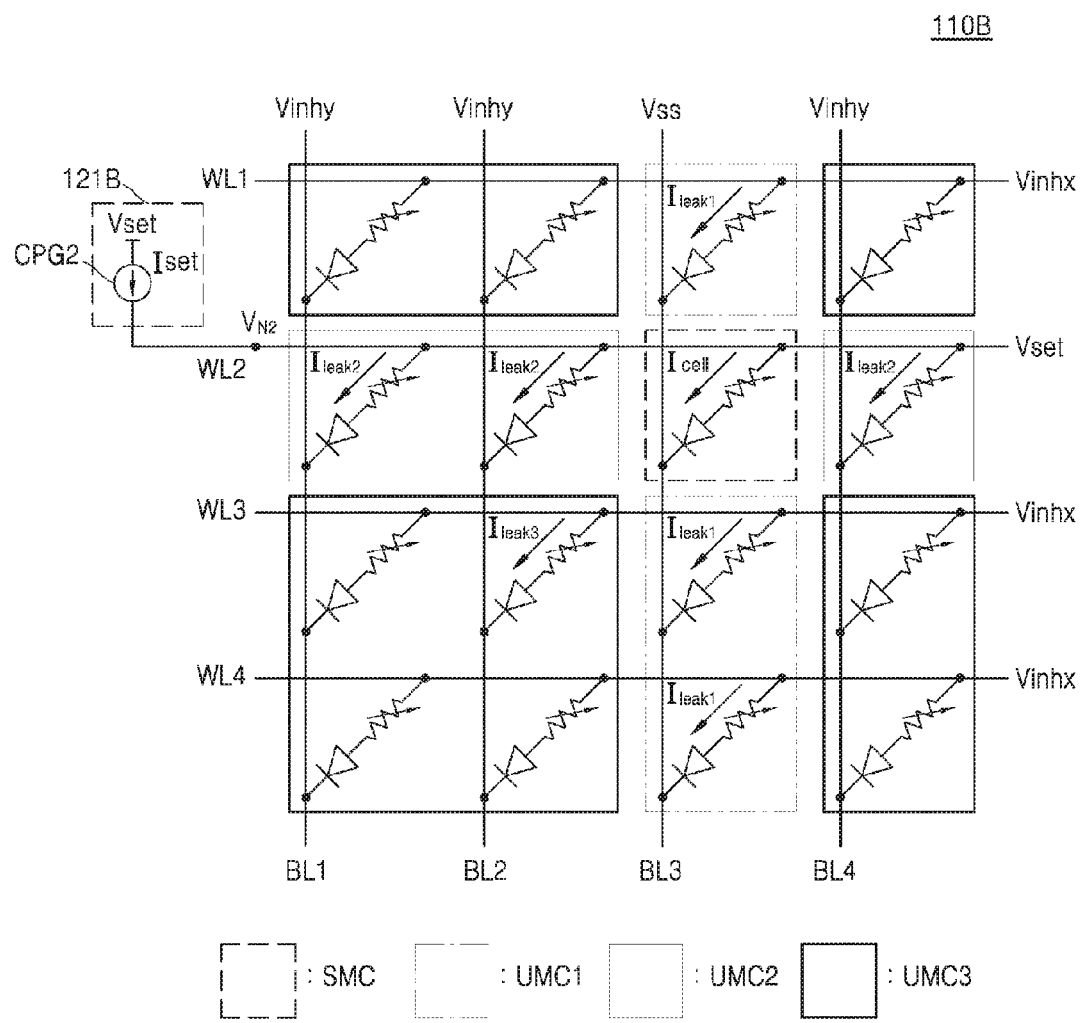
FIG. 13 is a circuit diagram showing a connection relation between a memory cell array and a write circuit when a set writing operation is performed according to another exemplary embodiment of the inventive concept.

FIG. 13 is a circuit diagram showing a connection relation between a memory cell array 110B and a write circuit 121B when a set writing operation is performed according to another exemplary embodiment of the inventive concept.

Referring to FIG. 13, the write circuit 121B may include a current pulse generator CPG2, and the current pulse generator CPG2 may generate the set current Iset, an amplitude or a pulse width of which is increased according to the number of times the programming loops are performed. The write circuit 121B may be connected to the selected word line, and may provide the selected memory cell SMC with the set current Iset via the selected word line.

For example, according to the address ADDR provided from the memory controller 200, the selected word line may be the second word line WL2 and the selected bit line may be the third bit line BL3. Here, first, second, and fourth bit lines BL1, BL2, and BL4 are unselected bit lines and first, third, and fourth word lines WL1, WL3, and WL4 are unselected word lines.

The write circuit 121B is connected to the second word line WL2 to provide the selected memory cell SMC with the set current Iset via the second word line WL2. Accordingly, the set writing operation may be performed so that the resistance of the selected memory cell SMC is reduced.

Hereinafter, memory cells arranged on regions where the unselected word lines WL1, WL3, and WL4 and the selected bit line BL3 cross each other will be referred to as first unselected memory cells UMC1. The first unselected memory cells UMC1 may be also referred to as half-selected memory cells. Here, the leakage current that may occur in the first unselected memory cells UMC1 may be referred to as a first leakage current Ileak1.

Memory cells arranged on regions where the unselected bit lines BL1, BL2, and BL4 and the selected word line WL2 cross each other may be referred to as second unselected memory cells UMC2. The second unselected memory cells UMC2 may also be referred to as half-selected memory cells. Here, the leakage current that may occur in the second unselected memory cells UMC2 may be referred to as a second leakage current Ileak2.

Also, memory cells arranged on regions where the unselected bit lines BL1, BL2, and BL4 and the unselected word lines WL1, WL3, and WL4 cross each other may be referred to as third unselected memory cells UMC3. Here, a leakage current that may occur in the third unselected memory cells UMC3 is referred to a third leakage current Ileak3.

Figure 14A:
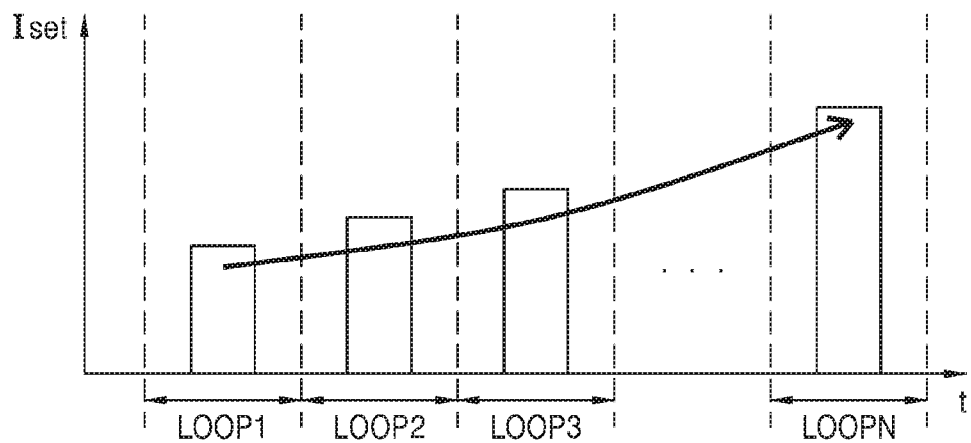
FIG. 14A is a graph showing an example of a set current provided from the write circuit of FIG. 13.

FIG. 14A is a graph showing an example of the set current Iset provided from the write circuit 121B of FIG. 13.

Referring to FIG. 14A, a horizontal axis denotes time and a vertical axis denotes the set current Iset. In the present exemplary embodiment, the set current Iset may include a plurality of pulses having amplitudes that are gradually increased as the number of times the programming loops are performed increases. However, one or more exemplary embodiments of the inventive concept are not limited thereto, that is, in another exemplary embodiment, the set current Iset may include a plurality of pulses having pulse widths that are gradually increased as the number of times the programming loops are performed increases. Also, in another exemplary embodiment, the set current Iset may include a plurality of pulses having amplitudes or pulse widths that are non-linearly increased as the number of times the programming loops are performed increases.

Figure 14B:
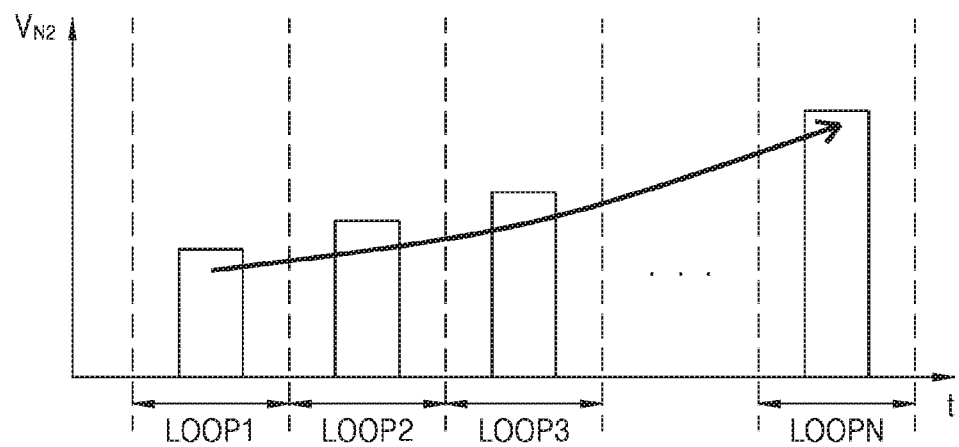
FIG. 14B is a graph showing an example of a node voltage at a connection node between the write circuit of FIG. 13 and a selected word line.

FIG. 14B is a graph showing an example of a node voltage $V_{N2}$ at a connection node CN2 between the write circuit 121B of FIG. 13 and the selected word line.

Referring to FIG. 14B, a horizontal axis denotes time and a vertical axis denotes the node voltage $V_{N2}$ at the connection node CN2 between the write circuit 121B and the selected word line. In the present exemplary embodiment, as the set current Iset increases, the node voltage $V_{N2}$ at the connection node CN2 between the write circuit 121B and the selected word line also increases. That is, the node voltage $V_{N2}$ at the connection node CN2 is changed in proportion to the set current Iset.

Therefore, if the first inhibit voltages Vinhy applied to the unselected bit lines BL1, BL2, and BL4 are constant, the voltage difference between the node voltage $V_{N2}$ at the connection node CN2 and the first inhibit voltage Vinhy increases. As such, the second leakage current Ileak2 that may occur in the second unselected memory cells UMC2 that are arranged respectively on the regions where the second word line WL2 and the unselected word lines BL1, BL2, and BL4 cross each other may increase.

Figure 15:
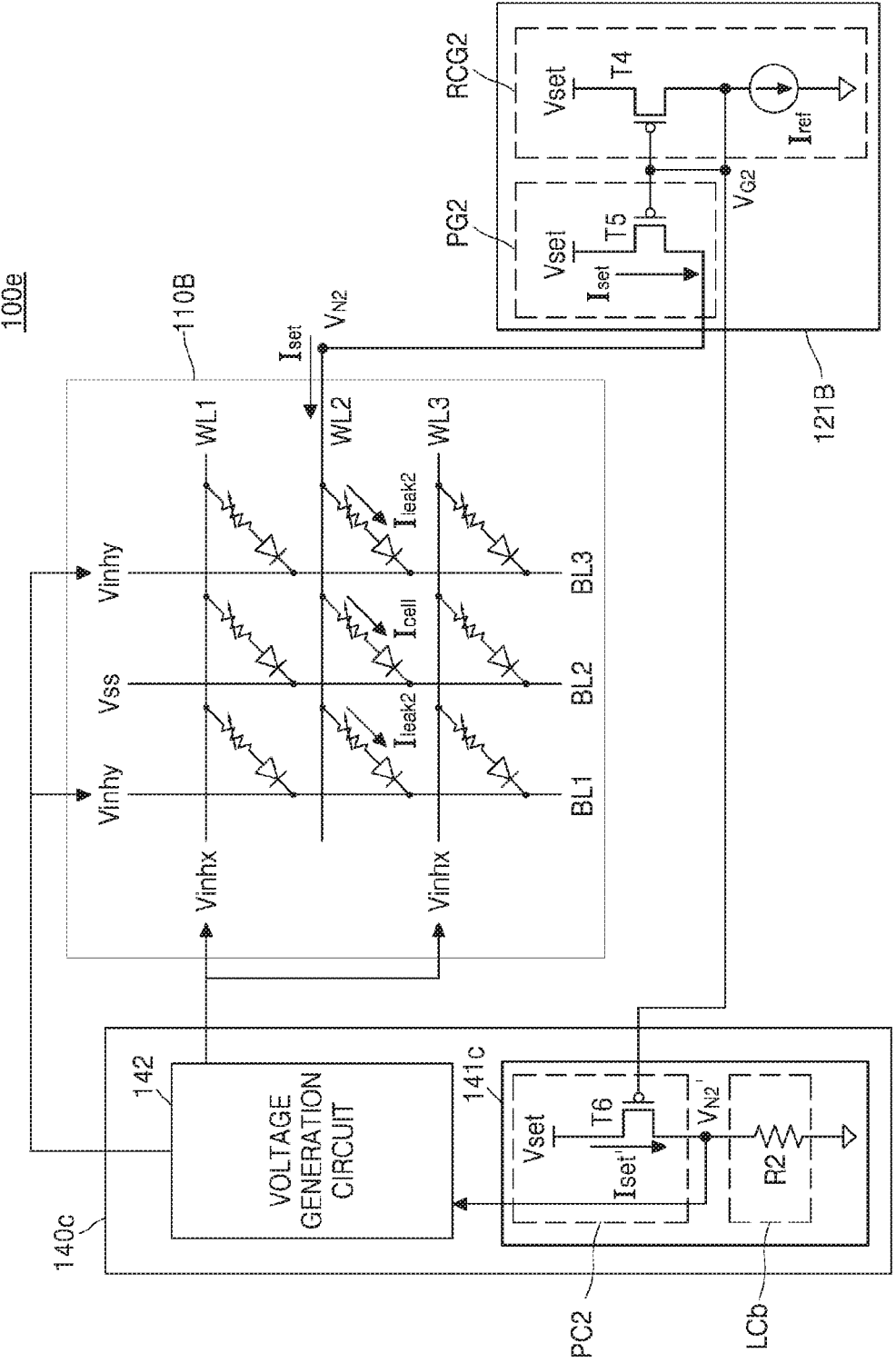
FIG. 15 is a circuit diagram of a memory device including an inhibit voltage generator according to another embodiment of the inventive concept.

FIG. 15 is a circuit diagram of a memory device 100e including an inhibit voltage generator 140c according to another exemplary embodiment of the inventive concept.

Referring to FIG. 15, the memory device 100e may include the memory cell array 110B, the write circuit 121B, and the inhibit voltage generator 140c. The inhibit voltage generator 140c may include a voltage detector 141c and the voltage generation circuit 142.

The memory device 100e of the present exemplary embodiment is a modified example of the memory device 100 of FIG. 6, and the above descriptions with reference to FIG. 6 may be applied to the present exemplary embodiment.

The write circuit 121B may include a reference current generator RCG2 for generating the reference current Iref, and a pulse generator PG2 for generating current pulses based on the reference current Iref. The pulse generator PG2 may generate the set current Iset. A fourth transistor T4 of the reference current generator RCG2 and a fifth transistor T5 of the pulse generator PG2 may form a current mirror circuit. The first and fifth transistors T4 and T5 may be PMOS transistors.

When the reference current Iref flows through the fourth transistor T4, a drain voltage of the fourth transistor T4 is applied as a gate voltage VG2 of the fourth and fifth transistors T4 and T5. The current pulse flowing in the fifth transistor T5, for example, the set current Iset, may be in proportion to the reference current Iref.

The voltage detector 141c detects a voltage level of the node voltage $V_{N2}$, and provides the detected voltage level to the voltage generation circuit 142. The voltage detector 141c according to the present exemplary embodiment may include a pulse copy unit PC2 and a load circuit LCb.

The pulse copy unit PC2 may generate a current pulse Iset' (hereinafter, referred to as a copy pulse) that is substantially equal to the current pulse generated by the write circuit 121B, for example, the set current Iset. The pulse copy unit PC2 may be a current mirroring circuit that mirrors the reference current Iref of the write circuit 121B to generate the copy pulse Iset'. The pulse copy unit PC2 may be substantially the same as the pulse generator PG2 of the write circuit 121B. The pulse copy unit PC2 may include a sixth transistor T6, and a size of the sixth transistor T6 (for example, a width and a length of the transistor) may be equal to that of the fifth transistor T5 in the pulse generator PG2. The sixth transistor T6 may be a PMOS transistor.

The pulse copy unit PC2 receives the gate voltage VG2 from the write circuit 121B, and may generate the copy pulse Iset' based on the gate voltage VG2. Since the size of the sixth transistor T6 is equal to that of the fifth transistor T5 and the same gate voltage VG2 is applied to the gates of the sixth transistor T6 and the fifth transistor T5, the current value of the copy pulse Iset' may be equal to that of the set current Iset.

The load circuit LCb is connected to the pulse copy unit PC2, and may receive the copy pulse Iset' from the pulse copy unit PC2. The copy pulse Iset' may flow through the load circuit LCb. As shown in the drawings, the load circuit LCb may include a resistor R2. An end of the resistor R2 is connected to the pulse copy unit PC2, and a ground voltage Vss may be applied to the other end of the resistor R2. A resistance value of the resistor R2 may be equal to a resistance value that is obtained by modelling resistance components of the selected memory cell, the selected word line, and the selected bit line.

As described above, since the resistance value of the resistor R2 is similar to the resistance components of the selected memory cell, the selected word line, and the selected bit line, and the current of the same current value flows in the fifth transistor T5 of the write circuit 121B and the sixth transistor T6 of the voltage detector 141c, the drain voltages of the fifth transistor T5 and the sixth transistor T6 may be equal to each other. Therefore, a node voltage $V_{N2}'$ at a connection node between the load circuit LCb and the pulse copy unit PC2 may be equal to the node voltage $V_{N2}$ at the connection node between the write circuit 121B and the selected word line WL2. Accordingly, the voltage detector 141c may detect the voltage level of the node voltage $V_{N2}'$ at the connection node between the load circuit LCb and the pulse copy unit PC2 as a voltage level of the node voltage $V_{N2}$ between the write circuit 121B and the selected bit line.

The voltage generation circuit 142 may change the voltage level of the first inhibit voltage Vinhy based on the detected node voltage $V_{N2}$. As described above with reference to FIGS. 14A and 14B, the write circuit 121B may provide the set current Iset that increases according to the number of times the programming loops are performed. Accordingly, the node voltage $V_{N2}$ at the connection node between the selected word line WL2 and the write circuit 121B may increase according to the number of times the programming loops are performed. The voltage generation circuit 142 may increase the voltage level of the first inhibit voltage Vinhx corresponding to the increase in the node voltage $V_{N2}$, to prevent the increase of the leakage current Ileak2 in the memory cells connected to the unselected bit lines BL1 and BL3 and the selected word line WL2. The voltage generation circuit 142 may continuously or discretely increase the voltage level of the second inhibit voltage Vinhx according to the increase in the node voltage $V_{N2}$. Moreover, the voltage generation circuit 142 may adjust the voltage level of the second inhibit voltage Vinhx so that the voltage difference between the unselected word lines WL1 and WL3 and the selected bit line BL2 may be maintained constantly.

Figure 16:
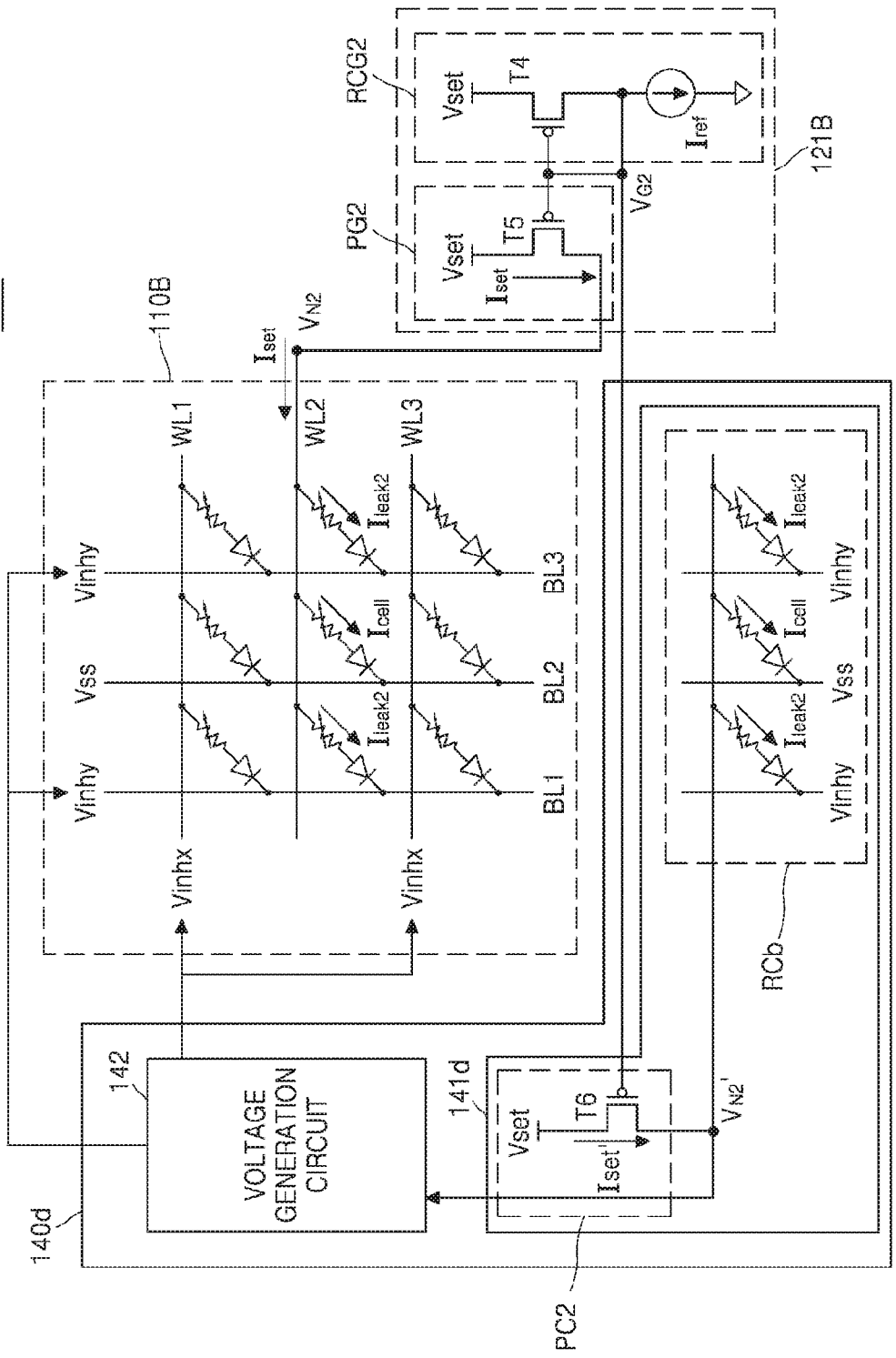
FIG. 16 is a schematic circuit diagram of a memory device including an inhibit voltage generator according to another exemplary embodiment of the inventive concept.

FIG. 16 is a schematic circuit diagram of a memory device 100f including an inhibit voltage generator 140d according to another exemplary embodiment of the inventive concept. The inhibit voltage generator 140d is a modified example of the inhibit voltage generator 140c of FIG. 15. Therefore, the above-described elements are not described here.

Referring to FIG. 16, a voltage detector 141d may include a voltage copy unit PC2 and a reference cell array RCb. The reference cell array RCb may correspond to the load circuit LCb of FIG. 15, and the copy pulse Iset' may flow through the reference cell array RCb.

The reference cell array RCb may include reference cells corresponding to memory cells included in at least one row or column in the memory cell array 110B. For example, as shown in FIG. 16, the reference cell array RCb may include memory cells corresponding to one column in the memory cell array 110B. The reference cells may correspond to the memory cells connected to the selected word line WL2, and the voltages applied to corresponding memory cells may be applied respectively to the reference cells. Therefore, the copy pulse Iset' that is equal to the set current Iset may flow through the reference cell array RCb, and a voltage $V_{N2}'$ at the connection node between the reference cell array RCb and the pulse copy unit PC2 may be equal to the node voltage $V_{N2}$ at the connection node between the write circuit 121B and the selected word line WL2.

Figure 17:
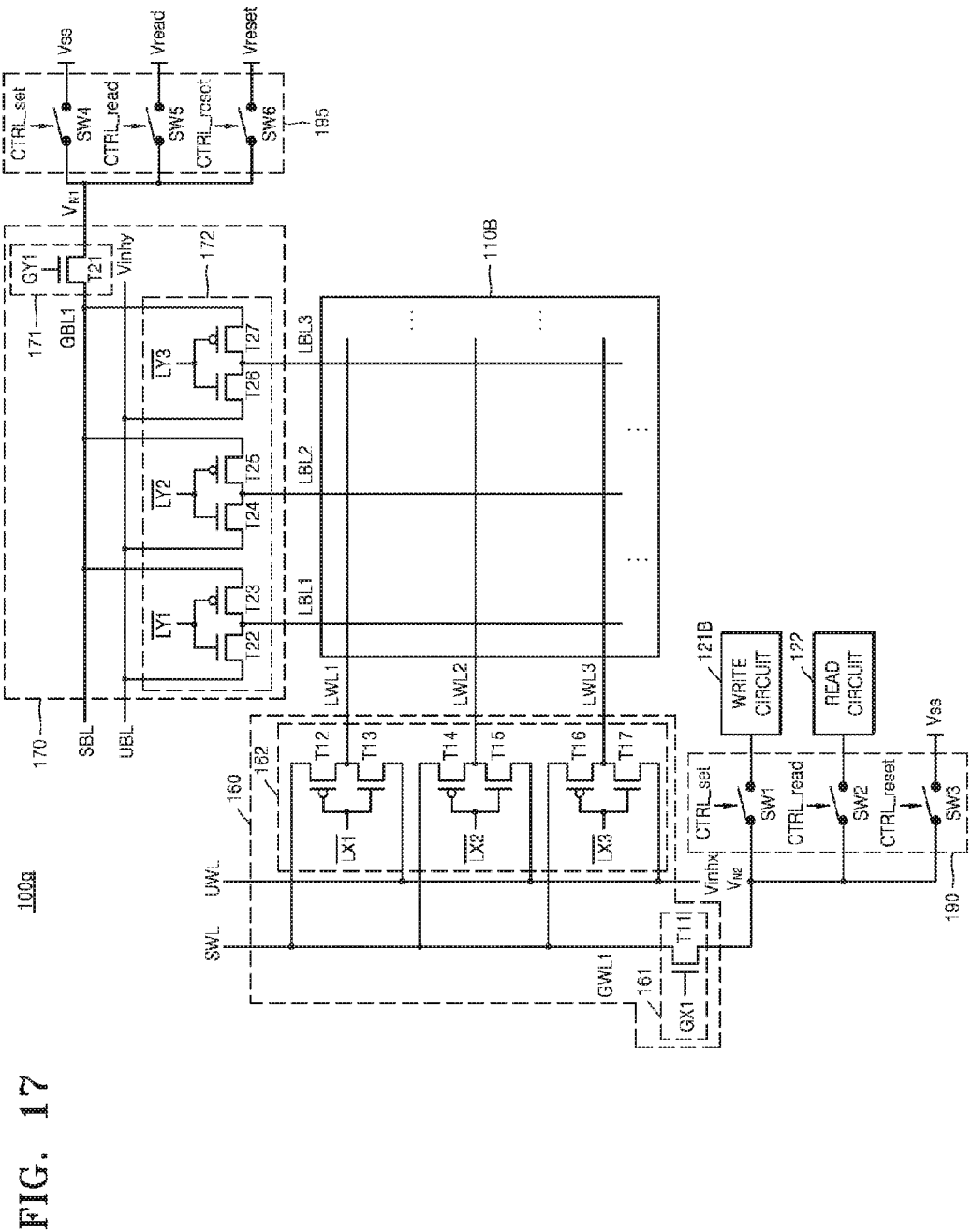
FIG. 17 is a circuit diagram of a memory device including the memory cell array and the write circuit of FIG. 13.

FIG. 17 is a circuit diagram of a memory device 100g including the memory cell array 110B and the write circuit 121B of FIG. 13.

Referring to FIG. 17, the memory device 100g includes the memory cell array 110B, the write circuit 121B, the read circuit 122, the row decoder 160, the column decoder 170, and the first and second switching units 190 and 195. The memory device 100g of the present exemplary embodiment is a modified example of the memory device 100 of FIG. 2, and thus, the above descriptions with reference to FIG. 2 may be also applied to the present exemplary embodiment. Also, although not shown in FIG. 17, the elements included in the memory device 100 of FIG. 2 may be also included in the memory device 100g of the present exemplary embodiment.

The memory device 100g of FIG. 17 is similar to the memory device 100d of FIG. 11. However, the write circuit 121B and the read circuit 122 may be connected to the local word lines LWL1, LWL2, and LWL3 via the first switching unit 190 and the row decoder 160 in FIG. 17, while the write circuit 121A and the read circuit 122 are connected to the local bit lines LBL1, LBL2, and LBL3 via the second switching unit 195 and the column decoder 170 in FIG. 11.

The first switch SW1 of the first switching unit 190 is turned on/off according to the set selection signal CTRL_set so as to connect the write circuit 121B to the first global word line GWL1. The second switch SW2 is turned on/off according to the read selection signal CTRL_read so as to connect the read circuit 122 to the first global word line GWL1. The third switch SW3 is turned on/off according to the reset selection signal CTRL_reset so as to connect the voltage generator 150 (see FIG. 1) to the first global word line GWL1. As such, the ground voltage Vss may be applied to the first global word line GWL1. Here, the set selection signal CTRL_set, the read selection signal CTRL_read, and the reset selection signal CTRL_reset may be provided from the control logic 130.

The fourth to sixth switches SW4 to SW6 of the second switching unit 195 are respectively turned on/off according to the set selection signal CTRL_set, the read selection signal CTRL_read, and the reset selection signal CTRL_reset so as to connect the voltage generator 150 (see FIG. 1) to the first global bit line GBL1, and as such, the ground voltage Vss, the read voltage Vread, and the reset voltage Vreset may be applied to the first global bit line GBL1.

Figure 18:
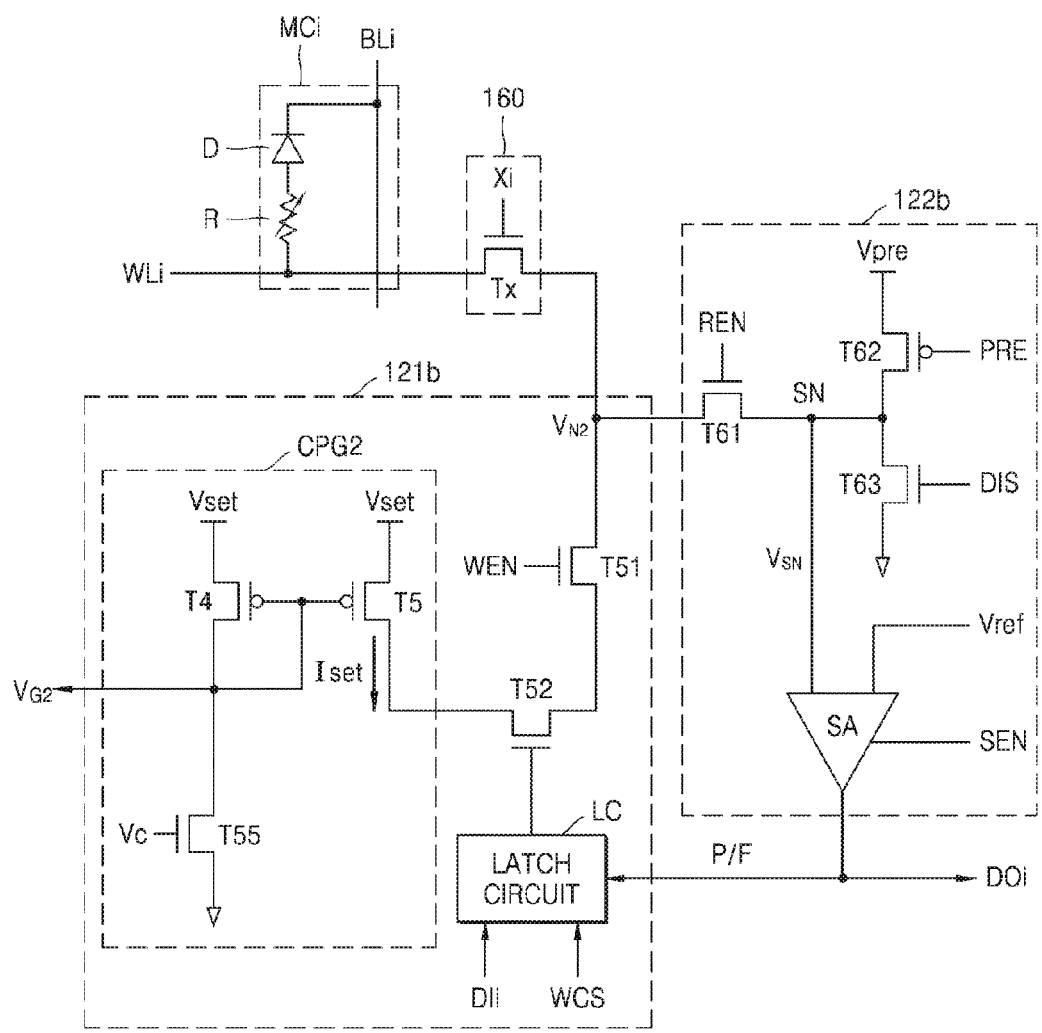
FIG. 18 is a circuit diagram of the write circuit of FIGS. 15 and 16 in detail.

FIG. 18 is a circuit diagram showing an example of the write circuit 121B of FIGS. 15 and 16 in detail.

Referring to FIG. 18, the memory cell MCi is arranged on the region where the bit line BLi and the word line WLi cross each other, and may include the variable resistive device R and the selection device D. The row decoder 160 may include a word line selection transistor Tx, and the word line selection transistor Tx may connect the memory cell MCi to the write circuit 121b or the read circuit 122b in response to a row address Xi.

Structures and functions of the write circuit 121b and the read circuit 122b of FIG. 18 are similar to those of the write circuit 121a and the read circuit 122a described above with reference to FIG. 12. However, the write circuit 121b and the read circuit 122b of FIG. 18 may be connected to the word line WLi, while the write circuit 121a and the read circuit 122a of FIG. 12 are connected to the bit line BLi.

The write circuit 121b may include a current pulse generator CPG2 that is a current mirroring circuit including transistors T4, T5, and T55. The current pulse generator CPG2 generates the set current Iset, and sources the set current Iset to the memory cell MCi via the word line WLi connected to the memory cell MCi.

The operations of the read circuit 122b are similar to those of the read circuit 122a of FIG. 12, and thus, detailed descriptions thereof are omitted here. The read circuit 122b is connected to the word line WLi in FIG. 18, but is not limited thereto. The read circuit 122b may be connected to the bit line BLi via the column decoder.

Figure 19:
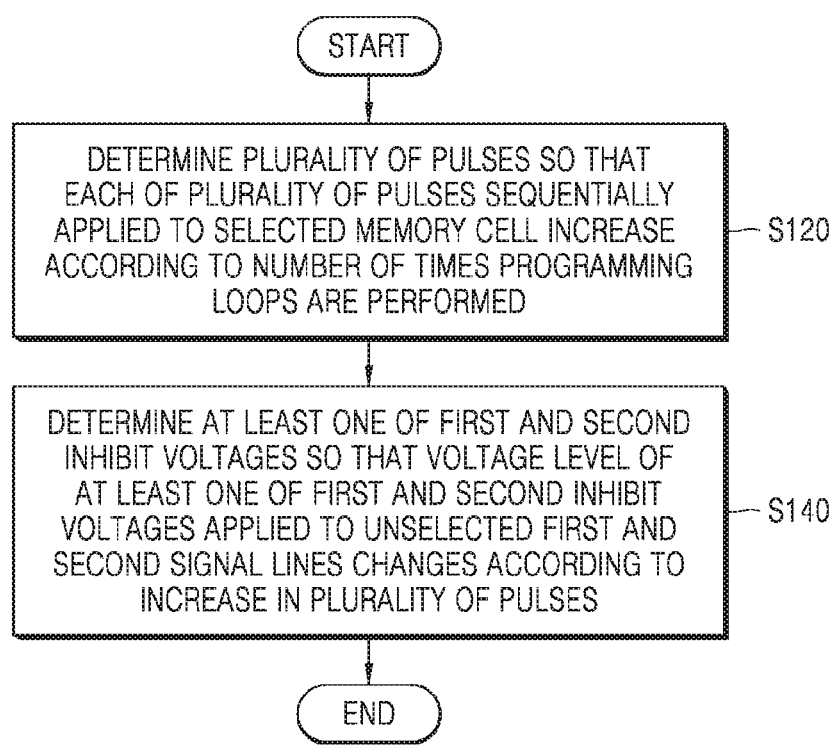
FIG. 19 is a flowchart illustrating a method of operating a memory device according to an exemplary embodiment of the inventive concept.

FIG. 19 is a flowchart illustrating a method of operating a memory device according to an exemplary embodiment of the inventive concept.

Referring to FIG. 19, the method of operating the memory device according to the present exemplary embodiment is a method of performing operations for determining voltages applied to a plurality of memory cells to perform the write operations on the memory cells included in a memory cell array of the memory device. The descriptions provided above with reference to FIGS. 1 to 18 may be applied to the method of operating the memory device according to the present exemplary embodiment. Hereinafter, the method of operating the memory device according to the present exemplary embodiment will be described below with reference to FIGS. 1 to 18.

In operation S120, a plurality of pulses are determined so that each of the plurality of pulses that are sequentially applied to the selected memory cell may increase according to the number of times programming loops are performed. In particular, the plurality of pulses may be determined so that at least one of the amplitudes or the pulse widths of the plurality of pulses may increase as the number of times the programming loops are performed. However, one or more exemplary embodiments of the inventive concept are not limited thereto, and in another exemplary embodiment, the plurality of pulses may be determined so that the plurality of pulses sequentially applied to the selected memory cell may be reduced according to the number of times the programming loops are performed.

In one exemplary embodiment, the plurality of pulses may correspond to a plurality of current pulses, and in operation S120, the plurality of current pulses may be determined so that at least one of the amplitudes and the pulse widths of the current pulses may increase as the number of times the programming loops are performed increases. Also, the method may further include an operation of performing a set write operation for reducing resistance level of the selected memory cell by applying the plurality of current pulses sequentially to the selected memory cell.

In another exemplary embodiment, the plurality of pulses may correspond to a plurality of voltage pulses, and operation S120 may determine the plurality of voltage pulses so that at least one of the amplitudes and the pulse widths of the plurality of voltage pulses may increase according to the number of times the programming loops are performed. Also, the method may further include an operation of performing a reset write operation for increasing the resistance level of the selected memory cell by applying the plurality of voltage pulses sequentially to the selected memory cell.

In operation S140, at least one of the first and second inhibit voltages that are respectively applied to unselected first and second signal lines is determined so that the voltage level of at least one of the first and second inhibit voltages may be changed according to the increase in the plurality of pulses, to correspond to the increase in the plurality of pulses. In particular, the plurality of pulses may be provided sequentially from the write circuit, and the write circuit may be connected to the selected first signal line that is connected to the selected memory cell. The at least one of the first and second inhibit voltages may be adaptively determined according to the variation in the node voltage at the connection node between the write circuit and the selected first signal line according to the increase in the pulses.

In one exemplary embodiment, if the voltage of the selected first signal line is reduced according to the increase in the pulse, the second inhibit voltages may be determined to be reduced according to the number of times the programming loops are performed. Moreover, the first inhibit voltages may be determined so that the first inhibit voltages may be reduced according to the number of times of performing the programming loops, according to the reduction in the second inhibit voltages.

In another exemplary embodiment, if the voltages of the selected first signal line is increased according to the increase of the pulses, the second inhibit voltages may be determined to be increased according to the number of times the programming loops are performed. Moreover, the first inhibit voltages may be determined to be increased according to the number of times the programming loops are performed, according to the increase in the second inhibit voltages.

Figure 20:
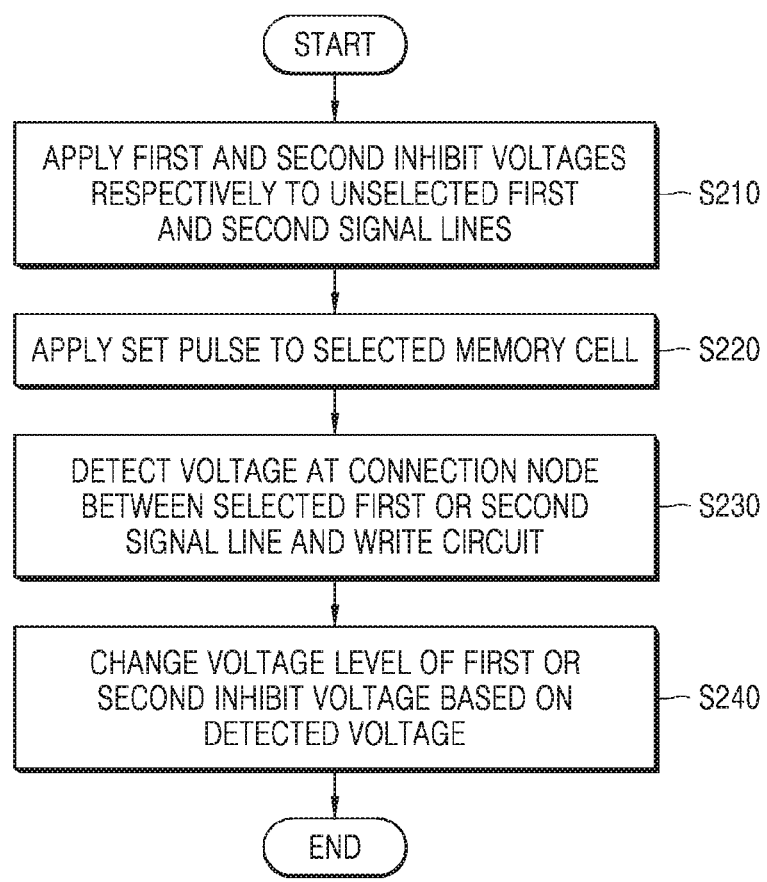
FIG. 20 is a flowchart illustrating an example of an operation of determining at least one inhibit voltage of FIG. 19.

FIG. 20 is a flowchart illustrating operation S140 of FIG. 19 in more detail.

Referring to FIG. 20, in operation S210, the first and second inhibit voltages are applied to the unselected first and second signal lines, and in operation S220, a set pulse is applied to the selected memory cell to perform a programming operation on the selected memory cell. Here, the voltage levels of the first and second inhibit voltages may be determined by an inhibit control signal CTRL_inh provided from the control logic 130 (see FIG. 2).

In operation S230, the voltage at the connection node between the selected first or second signal line and the write circuit is detected. In one exemplary embodiment, the node voltage may be detected in every programming loop. In another exemplary embodiment, the node voltage may be detected in only some of the plurality of programming loops.

In operation S240, the voltage level of the first or second inhibit voltage is changed based on the detected node voltage. In one exemplary embodiment, if the first signal line and the write circuit are connected to the each other, the voltage level of the second inhibit voltages. In another exemplary embodiment, if the second signal line and the write circuit are connected to each other, the voltage level of the first inhibit voltage may be changed. If the node voltage decreases, the voltage level of the first or second voltage level is reduced, and if the node voltage increases, the voltage level of the first or second inhibit voltage may be increased.

Figure 21:
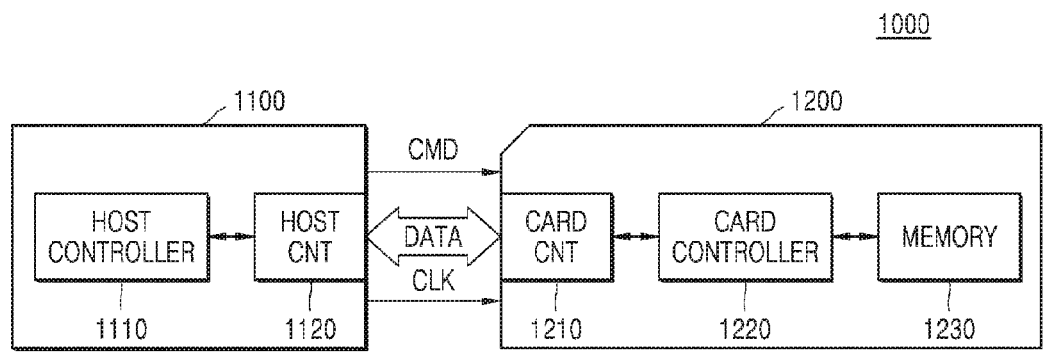
FIG. 21 is a block diagram of a memory card system to which a memory system according to an exemplary embodiment of the inventive concept is applied.

FIG. 21 is a block diagram of a memory card system 1000 having a memory system applied thereto, according to an exemplary embodiment of the inventive concept.

Referring to FIG. 21, the memory card system 1000 may include a host 1100 and a memory card 1200. The host 1100 may include a host controller 1110 and a host connector 1120. The memory card 1200 may include a card connector 1210, a card controller 1220, and a memory device 1230. Here, the memory card 1200 may be embodied by using the exemplary embodiments shown in FIGS. 1 through 20. The memory card 1200 may reduce a leakage current that may occur in unselected memory cells of the memory device 1230 and may improve controllability of a cell current flowing in a selected memory cell of the memory device 1230.

The host 1100 may write data to the memory 1200 or may read data stored in the memory card 1200. The host controller 1110 may transmit a command CMD, a clock signal CLK generated by a clock generator (not shown) in the host 1100, and data DATA to the memory card 1200 via the host connector 1120.

In response to the command CMD received via the card connector 1210, the card controller 1220 may store the data DATA in the memory device 1230, in synchronization with a clock signal that is generated by a clock generator (not shown) in the card controller 1220. The memory device 1230 may store the data DATA that is transmitted from the host 1100.

The memory card 1200 may be embodied as a compact flash card (CFC), a microdrive, a smart media card (SMC), a multimedia card (MMC), a Security Digital Card (SDC), a memory stick, or a USB flash memory drive.

Figure 22:
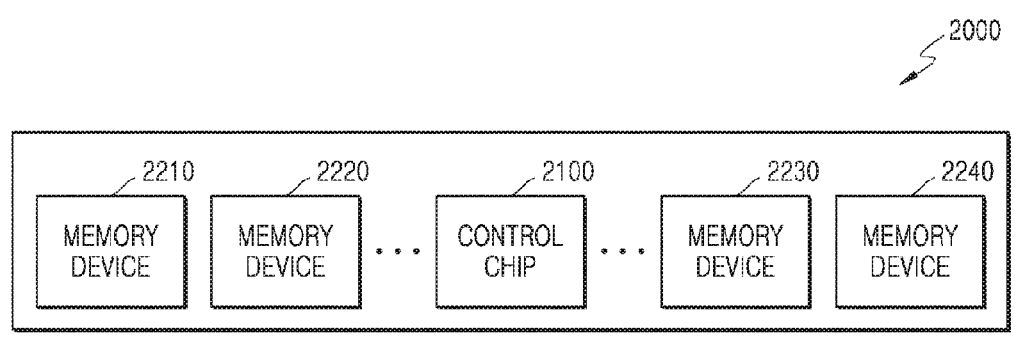
FIG. 22 is a diagram of a resistive memory module according to an exemplary embodiment of the inventive concept.

FIG. 22 illustrates a resistive memory module 2000, according to an exemplary embodiment of the inventive concept. Referring to FIG. 22, the resistive memory module 2000 may include memory devices 2210 through 2240, and a control chip 2100. Each of the memory devices 2210 through 2240 may be embodied by using the exemplary embodiments shown in FIGS. 1 through 19. Therefore, the resistive memory module 2000 may reduce a leakage current that may occur in memory cell array of each of the memory devices 2210 through 2240.

In response to various signals transmitted by an external memory controller, the control chip 2100 may control the memory devices 2210 through 2240. For example, according to various commands and addresses that are transmitted from an external source, the control chip 2100 may activate the memory devices 2210 through 2240 corresponding to the various commands and addresses and thus may control write and read operations. Also, the control chip 2100 may perform various post processing operations on read data output from each of the memory devices 2210 through 2240, e.g., the control chip 2100 may perform error detection and correction operations on the read data. Also, the control chip 2100 may control the memory devices 2210 to 2240 so as to adjust the number of inhibit voltages generated by each of the memory devices 2210 to 2240 or voltage differences between the inhibit voltages.

Figure 23:
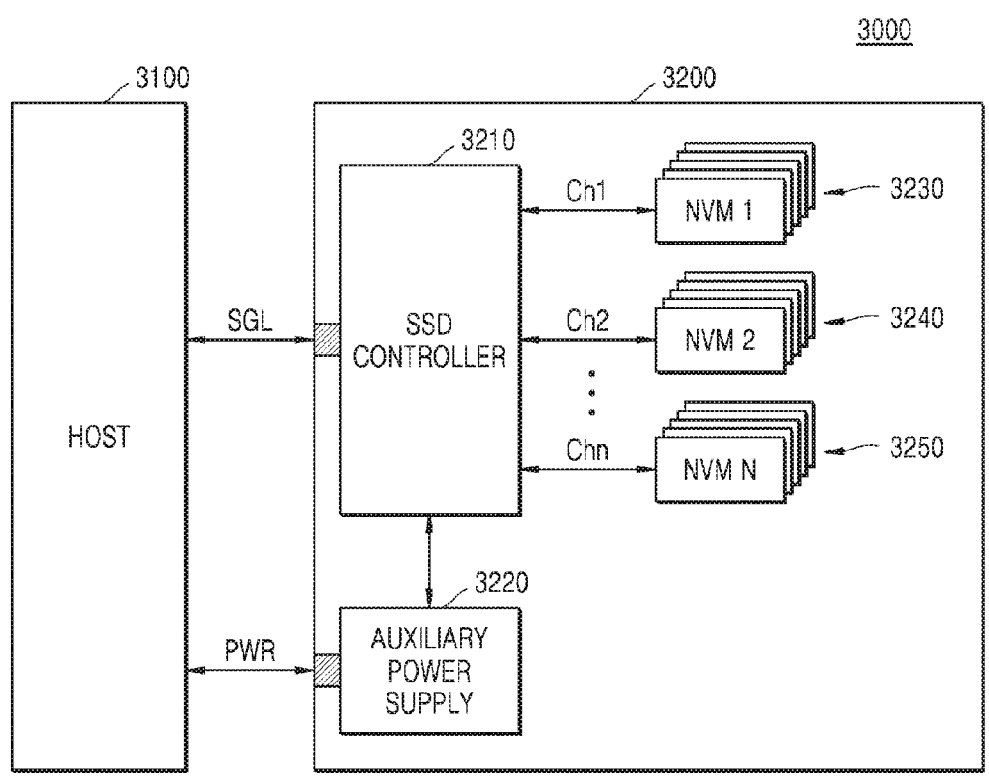
FIG. 23 is a block diagram of a solid state disk (SSD) system to which a memory system according to an exemplary embodiment of the inventive concept is applied.

FIG. 23 is a block diagram of a solid state drive (SSD) system 3000 including a memory system applied thereto, according to an exemplary embodiment of the inventive concept.

Referring to FIG. 23, the SSD system 3000 may include a host 3100 and an SSD 3200. The SSD 3200 exchanges signals with the host 3100 via a signal connector, and may receive a power input from a power connector. The SSD 3200 includes an SSD controller 3210, an auxiliary power device 3220, and a plurality of memory devices 3230, 3240, and 3250. Here, the SSD 3200 may be embodied by using the exemplary embodiments of FIGS. 1 through 20. Therefore, the SSD 3200 may reduce a leakage current that may occur in memory cell array of each of the memory devices 3230, 3240, and 3250.

Figure 24:
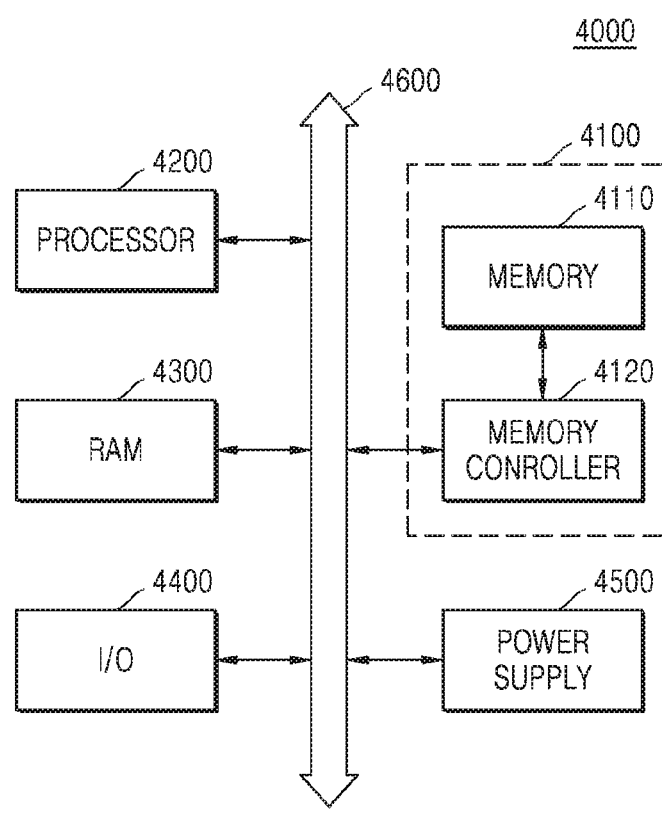
FIG. 24 is a block diagram of a computing system including a memory system according to an exemplary embodiment of the inventive concept.

FIG. 24 is a block diagram of a computing system 4000 including a memory system according to an exemplary embodiment of the inventive concept.

Referring to FIG. 24, the computing system 4000 may include a memory system 4100, a processor 4200, a RAM 4300, an input/output (I/O) device 4400, and a power supply device 4500. Although not illustrated in FIG. 24, the computing system 4000 may further include ports capable of communicating with a video card, a sound card, a memory card, or a USB device, or other electronic devices. The computing system 4000 may be embodied as a PC, or a portable electronic device such as a notebook computer, a mobile phone, a personal digital assistant (PDA), or a camera.

The processor 4200 may perform particular calculations or tasks. In one or more exemplary embodiments, the processor 4200 may be a micro-processor or a Central Processing Unit (CPU). The processor 4200 may perform communication with the RAM 4300, the I/O device 4400, and the memory system 4100 via a bus 4600 such as an address bus, a control bus, or a data bus. Here, the memory system 4100 include memory 4110 and memory controller 4120, and may be embodied by using the exemplary embodiments shown in FIGS. 1 through 20.

In one or more exemplary embodiments, the processor 4200 may also be connected to an extended bus such as a Peripheral Component Interconnect (PCI) bus.

The RAM 4300 may store data for operations of the computing system 4000. As described above, the memory device according to the one or more exemplary embodiments of the inventive concept may be applied to the RAM 4300. Alternatively, a DRAM, a mobile DRAM, an SRAM, a PRAM, an FRAM, or an MRAM may be used as the RAM 4300.

The I/O device 4400 may include an input unit such as a keyboard, a keypad, or a mouse, and an output unit such as a printer or a display. The power supply device 4500 may supply an operating voltage for the operations of the computing system 4000.

While the inventive concept has been particularly shown and described with reference to exemplary embodiments thereof, it will be understood that various changes in form and details may be made therein without departing from the spirit and scope of the following claims.

What is claimed is:

1. A resistive memory device comprising:
   a memory cell array comprising a plurality of resistive memory cells that are arranged respectively on regions where a plurality of first signal lines and a plurality of second signal lines cross each other;
   a write circuit connected to a selected first signal line that is connected to a selected memory cell from among the plurality of memory cells, and to provide pulses to the selected memory cell;
   a voltage detector to detect a node voltage at a connection node between the selected first signal line and the write circuit; and
   a voltage generation circuit to generate a first inhibit voltage and a second inhibit voltage that are applied respectively to unselected first and second signal lines connected to unselected memory cells from among the plurality of memory cells, and to change a voltage level of the second inhibit voltage based on the node voltage that is detected.

2. The resistive memory device of claim 1, wherein the write circuit is configured to generate the pulses based on a first voltage, and the voltage detector is configured to receive the first voltage from the write circuit and detect the node voltage based on the first voltage.

3. The resistive memory device of claim 2, wherein the write circuit comprises:
   a reference current generator to generate a reference current and output the first voltage; and
   a pulse generator to generate the pulses based on the first voltage and provide the pulses via the selected first signal line.

4. The resistive memory device of claim 2, wherein the voltage detector comprises:
   a pulse copy unit to generate copy pulses corresponding to the pulses and based on the first voltage; and
   a load circuit connected to the pulse copy unit and to receive the plurality of copy pulses.

5. The resistive memory device of claim 4, wherein the voltage detector is configured to detect a voltage level at a connection node between the pulse copy unit and the load circuit as the voltage level of the node voltage.

6. The resistive memory device of claim 4, wherein the pulse copy unit comprises a current mirroring circuit to generate the copy pulses by mirroring the reference current based on the first voltage.

7. The resistive memory device of claim 4, wherein the load circuit comprises a resistor, and the resistor has a resistance value that corresponds to a sum of resistance components of the selected memory cell, and the selected first line and a second signal line connected to the selected memory cell.

8. The resistive memory device of claim 4, wherein the load circuit comprises a reference cell array corresponding to one of a row and a column in the memory cell array.

9. The resistive memory device of claim 8, wherein reference cells of the reference cell array correspond to memory cells, and a voltage that corresponds to a voltage applied to each memory cell corresponding to the reference cell is applied to each of the reference cells.

10. The resistive memory device of claim 1, wherein the pulses comprise a plurality of current pulses, and the write circuit increases at least one of an amplitude and a pulse width of each of the plurality of current pulses according to a number of times programming loops are performed.

11. The resistive memory device of claim 1, wherein the voltage generation circuit is configured to reduce the voltage level of the second inhibit voltage when a voltage level of the node voltage decreases.

12. The resistive memory device of claim 1, wherein the voltage generation circuit is configured to increase the voltage level of the second inhibit voltage when the voltage level of the node voltage increases.

13. A resistive memory device comprising:
   a memory cell array comprising a plurality of resistive memory cells arranged respectively on regions where a plurality of first signal lines and a plurality of second signal lines cross each other;
   a write circuit to provide set pulses to a selected first signal line that is connected to a selected memory cell, wherein at least one of an amplitude and a pulse width of each of the set pulses changes based upon a number of times programming loops are performed; and
   an inhibit voltage generator to generate a first inhibit voltage and a second inhibit voltage that are respectively applied to unselected first signal lines and unselected second signal lines connected to unselected memory cells, and to change a voltage level of the second inhibit voltage based upon a variation in a voltage of the selected first signal line due to the changes of the set pulses.

14. The resistive memory device of claim 13, wherein the inhibit voltage generator comprises:
   a voltage detector to detect a voltage level of the selected first signal line; and
   a voltage generation circuit to adjust the voltage level of the second inhibit voltage based upon the detected voltage level of the selected first signal line.

15. The resistive memory device of claim 13, wherein the plurality of set pulses correspond to a plurality of current pulses, and the write circuit comprises a pulse generator to generate the plurality of current pulses based on a reference current; wherein the inhibit voltage generator comprises a pulse copy unit to generate a plurality of copy current pulses that correspond to the plurality of current pulses based on the reference current, and a load circuit to which the plurality of current pulses are applied; and wherein the inhibit voltage generator is configured to detect a variation in the voltage level of the selected first signal line based on a voltage at a connection node between the pulse copy unit and the load circuit.

16. A resistive memory device comprising:
   a memory cell array comprising a plurality of resistive memory cells arranged at intersections of first and second signal lines;
   a write circuit connected to a selected first signal line that is connected to a selected memory cell from among the plurality of memory cells, and to provide pulses to the selected memory cell; and
   a voltage generation circuit to generate a first inhibit voltage and a second inhibit voltage that are applied respectively to unselected first and second signal lines connected to unselected memory cells from among the plurality of memory cells, and to adjust a voltage level of the second inhibit voltage based upon a voltage level of the selected first signal line.

17. The resistive memory device of claim 16, further comprising a voltage detector to detect the voltage level of the selected first signal line; wherein the voltage generation circuit is configured to adjust the voltage level of the second inhibit voltage based upon the detected voltage level of the selected first signal line.

18. The resistive memory device of claim 16, wherein the pulses comprise a plurality of current pulses, and the write circuit changes at least one of an amplitude and a pulse width of each of the plurality of current pulses based upon a number of times programming loops are performed.

19. The resistive memory device of claim 16, wherein the voltage generation circuit is configured to reduce the voltage level of the second inhibit voltage when the detected voltage level of the selected first signal line decreases.

20. The resistive memory device of claim 16, wherein the voltage generation circuit is configured to increase the voltage level of the second inhibit voltage when the detected voltage level of the selected first signal line increases.

* * * * *